(12) United States Patent
Matsuyama et al.

(10) Patent No.: US 9,692,205 B2
(45) Date of Patent: Jun. 27, 2017

(54) SEMICONDUCTOR LASER MODULE

(71) Applicant: FURUKAWA ELECTRIC CO., LTD., Tokyo (JP)

(72) Inventors: Tetsuya Matsuyama, Tokyo (JP); Naoki Hayamizu, Tokyo (JP); Toshio Kimura, Tokyo (JP); Jun Miyokawa, Tokyo (JP); Yuta Ishige, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/947,652

(22) Filed: Nov. 20, 2015

(65) Prior Publication Data

US 2016/0079728 A1  Mar. 17, 2016

Related U.S. Application Data

(63) Continuation of application No. PCT/JP2014/064512, filed on May 30, 2014.

(30) Foreign Application Priority Data

May 30, 2013  (JP) .................................. 2013-114607
May 30, 2013  (JP) .................................. 2013-114673

(51) Int. Cl.
*G02B 6/36* (2006.01)
*H01S 5/022* (2006.01)
(Continued)

(52) U.S. Cl.
CPC ........ *H01S 5/02284* (2013.01); *G02B 6/3616* (2013.01); *G02B 6/4206* (2013.01);
(Continued)

(58) Field of Classification Search
None
See application file for complete search history.

(56) References Cited

U.S. PATENT DOCUMENTS 5,179,610 A * 1/1993 Milburn ............... G02B 6/3813
385/147
9,453,967 B2 * 9/2016 Duesterberg ........... G02B 6/262
(Continued)

FOREIGN PATENT DOCUMENTS

JP  57-110523 U  12/1980
JP  01225909 A * 9/1989
(Continued)

OTHER PUBLICATIONS

International Search Report issued Aug. 26, 2014 in PCT/JP2014/064512 filed May 30, 2014 (with English translation).
(Continued)

*Primary Examiner* — Hemang Sanghavi
(74) *Attorney, Agent, or Firm* — Oblon, McClelland, Maier & Neustadt, L.L.P.

(57) ABSTRACT

A semiconductor laser module includes: a semiconductor laser element emitting a laser light; an optical fiber, into which the laser light emitted from the semiconductor laser element is incident, guiding the laser light; and an optical-fiber-holding unit having a fixing agent and holding the optical fiber, the fixing agent being for fixing the optical fiber. The fixing agent is provided at an area in which a power of a leakage light of the laser light having been incident into the optical fiber and then emitted to outside the optical fiber is low.

20 Claims, 18 Drawing Sheets

(51) Int. Cl.
*H01S 5/40* (2006.01)
*G02B 6/42* (2006.01)
*H01S 5/00* (2006.01)

(52) U.S. Cl.
CPC ......... *G02B 6/4239* (2013.01); *G02B 6/4296* (2013.01); *H01S 5/0071* (2013.01); *H01S 5/02252* (2013.01); *H01S 5/4012* (2013.01); *H01S 5/4025* (2013.01); *H01S 5/02216* (2013.01)

(56) References Cited

U.S. PATENT DOCUMENTS

| | | |
|---|---|---|
| 2004/0008744 A1 | 1/2004 | Okazaki et al. |
| 2009/0092358 A1* | 4/2009 | Watanabe ............... G02B 6/262 385/33 |
| 2009/0238521 A1 | 9/2009 | Oba |
| 2011/0242835 A1* | 10/2011 | Masuko ............... G02B 6/4239 362/551 |
| 2013/0022067 A1* | 1/2013 | Sakamoto ............ G02B 6/4238 372/34 |

FOREIGN PATENT DOCUMENTS

| | | |
|---|---|---|
| JP | 01-157304 U | 10/1989 |
| JP | 02-066503 | 3/1990 |
| JP | 02-161406 | 6/1990 |
| JP | 02-250009 | 10/1990 |
| JP | 04-096390 | 3/1992 |
| JP | 05-333218 | 12/1993 |
| JP | 06-068006 U | 9/1994 |
| JP | 2000-002821 | 1/2000 |
| JP | 2000-314819 | 11/2000 |
| JP | 2004-096088 | 3/2004 |
| JP | 2004-354771 | 12/2004 |
| JP | 2007-258480 | 10/2007 |
| JP | 2009-223149 | 10/2009 |
| WO | WO 2014/097710 A1 | 6/2014 |

OTHER PUBLICATIONS

Written Opinion issued Aug. 26, 2014 in PCT/JP2014/064512 filed May 30, 2014.

* cited by examiner

SEMICONDUCTOR LASER MODULE

CROSS-REFERENCE TO RELATED APPLICATION

This application is a continuation of PCT International Application No. PCT/JP2014/064512 filed on May 30, 2014 which claims the benefit of priority from Japanese Patent Application Nos. 2013-114607 and 2013-114673 filed on May 30, 2013, the entire contents of which are incorporated herein by reference.

BACKGROUND OF THE INVENTION

1. Field of the Invention

The present invention relates to a semiconductor laser module.

2. Description of the Related Art

Conventionally, a configuration has been known in which, in a semiconductor laser module outputting a laser light from an optical fiber, a laser light emitted from a semiconductor laser element is condensed by a light-condensing portion such as a lens, and the laser light condensed by the light-condensing portion is coupled to the optical fiber (see, for example, Japanese Patent Application Laid-open Publication No. 2004-96088).

In this case, the optical fiber is fixed on an optical-fiber-holding unit or the like with organic adhesive such as ultraviolet curable resin and thermosetting resin, or with fixing agent such as solder, melted by a YAG laser or an electric heater, low melting glass, and inorganic adhesive (see, for example, Japanese Patent Application Laid-open Publication No. 2007-258480).

SUMMARY OF THE INVENTION

It is an object of the present invention to at least partially solve the problems in the conventional technology.

In accordance with one aspect of the present invention, a semiconductor laser module includes: a semiconductor laser element emitting a laser light; an optical fiber, into which the laser light emitted from the semiconductor laser element is incident, guiding the laser light; and an optical-fiber-holding unit having a fixing agent and holding the optical fiber, the fixing agent being for fixing the optical fiber. The fixing agent is provided at an area in which a power of a leakage light of the laser light having been incident into the optical fiber and then emitted to outside the optical fiber is low.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
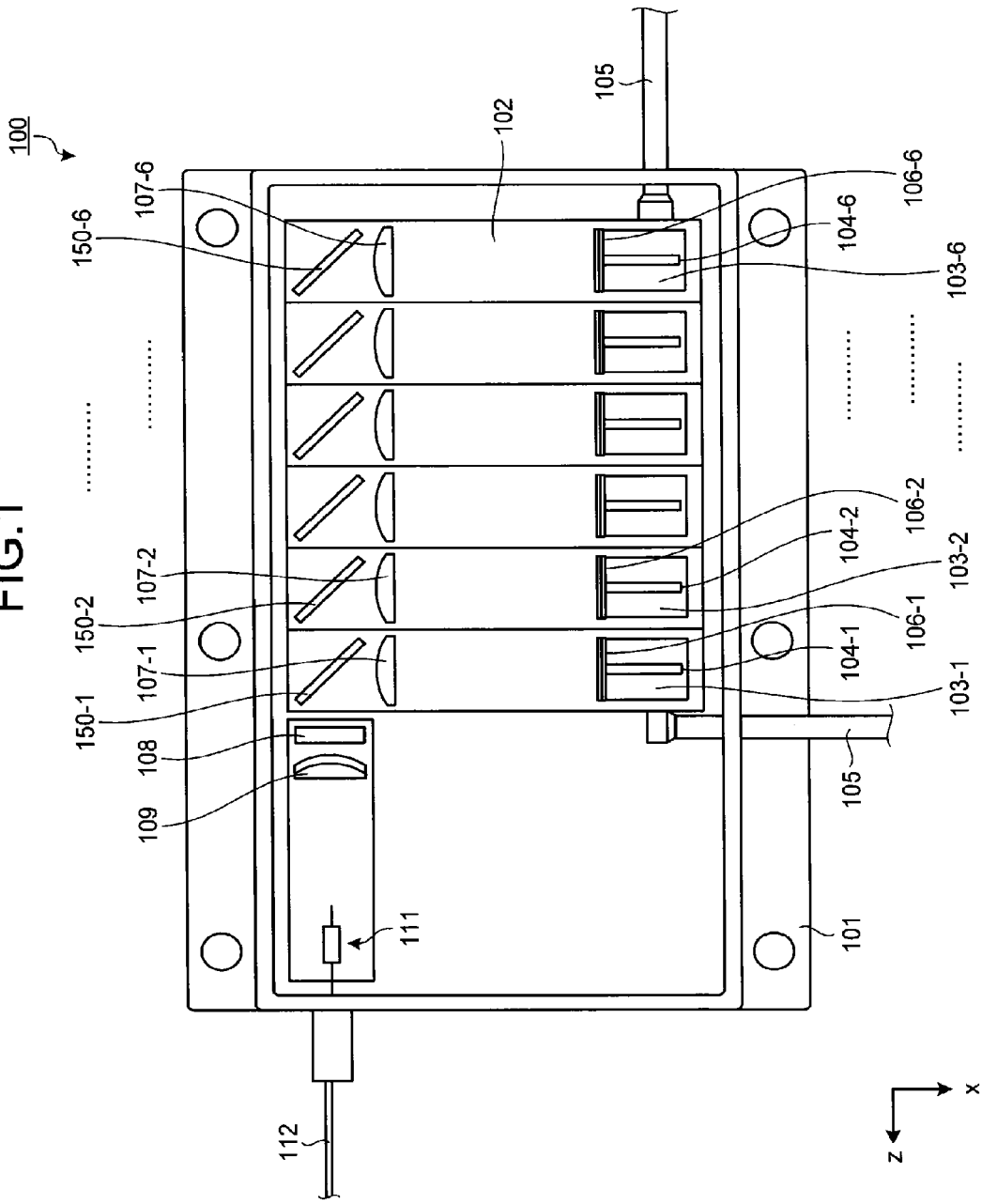
FIG. 1 is a schematic plan view of a semiconductor laser module according to Embodiment 1 of the present invention.

Hereafter, embodiments of a semiconductor laser module according to the present invention will be explained with reference to the drawings. The present invention is not limited to these embodiments. In all the drawings, identical or corresponding elements are given same reference numerals appropriately. It should be noted that the drawings show schematic examples. Accordingly, a relationship between respective elements may be different from real values. Among the drawings, there may be parts where the relationships and ratios of the shown sizes are different from one another.

In a case of attempting to couple a laser light, emitted from the semiconductor laser element, to the optical fiber, since it is difficult to couple the laser light to the optical fiber by 100%, a non-coupled light which is not coupled to the optical fiber is produced. Sometimes, the non-coupled light is irradiated to a fixing agent fixing the optical fiber.

Since the power of the laser light emitted from the semiconductor laser element of the semiconductor laser module herein for use in fields of laser machining and medical field is very large in degree, the power of the non-coupled light becomes large. For example, in a case where a coupling efficiency of the laser light, emitted from the semiconductor laser element, to the optical fiber is 85%, an approximately 10 W of non-coupled light is supposed to be produced when attempting to obtain 56 W of output power from the optical fiber. As described above, when an intense non-coupled light is irradiated to the fixing agent, the fixing agent may be melted or damaged sometimes.

When the fixing agent is subjected to melting or damage as such, the optical fiber may be possibly shifted from its fixed position. In this case, even though the optical fiber is positioned and fixed initially so that its coupling efficiency with the semiconductor laser element is the maximum, since its coupling loss increases because the fixing agent is melted or damaged, reliability of the semiconductor laser module may possibly be reduced.

In contrast, the embodiment described below achieves a highly reliable semiconductor laser module even when being operated at higher output.

Embodiment 1

Figure 2:
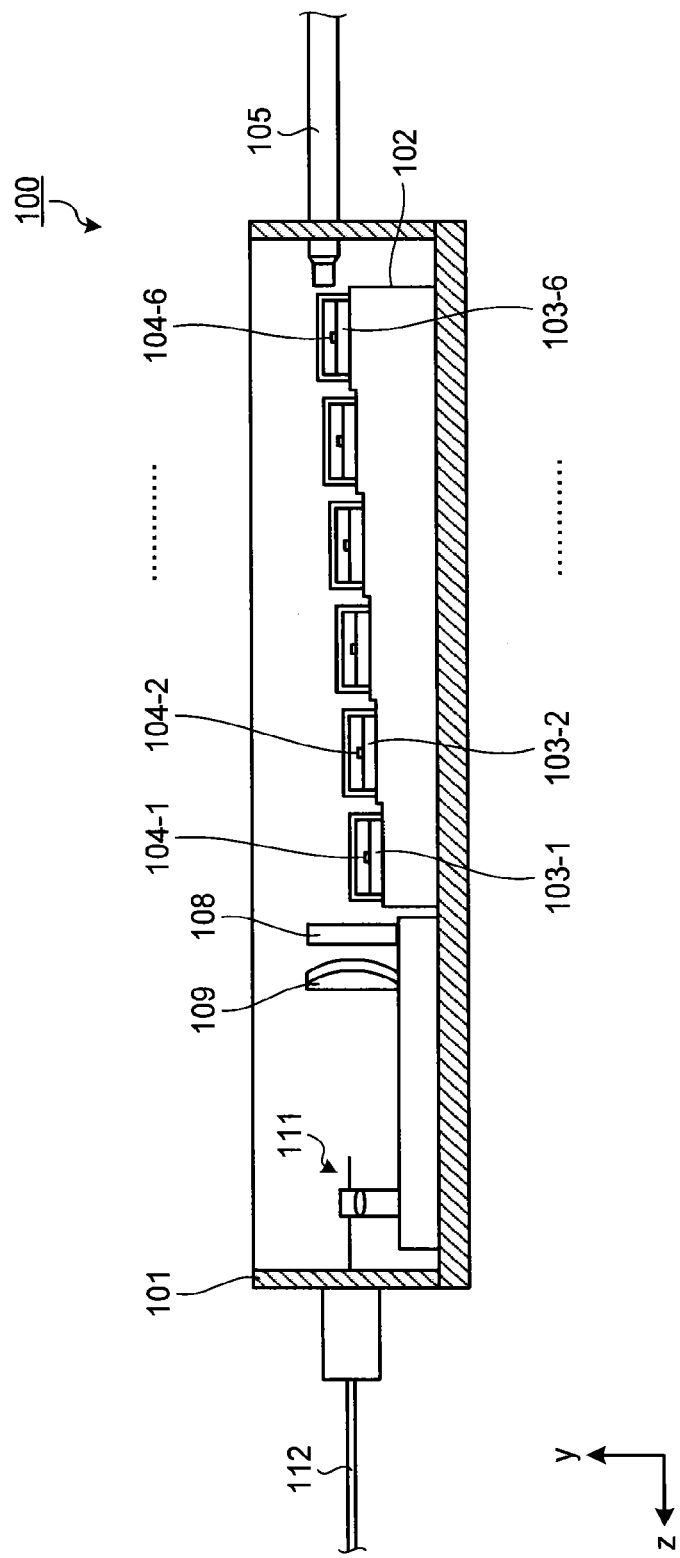
FIG. 2 is a schematic partially cutout view of the semiconductor laser module shown in FIG. 1.

Hereafter, a semiconductor laser module according to Embodiment 1 of the present invention will be explained. FIG. 1 is a schematic plan view of a semiconductor laser module according to Embodiment 1 of the present invention. FIG. 2 is a schematic partially cutout view of the semiconductor laser module shown in FIG. 1. In each drawing, a z-direction indicates a waveguide direction of the optical fiber, an x-direction indicates a horizontal direction that is orthogonal to the z-direction, and a y-direction indicates a vertical direction. Each direction is illustrated in the drawings if necessary. In FIGS. 1 and 2, an upper lid of a package is omitted. As shown in FIGS. 1 and 2, an LD-height-adjusting plate 102, sub-mounts 103-1 to 103-6, and semiconductor laser elements 104-1 to 104-6 are mounted and fixed in this order in a package 101 of a semiconductor laser module 100. A lead pin 105 is connected to the semiconductor laser module 100. First lenses 106-1 to 106-6, second lenses 107-1 to 107-6, and mirrors 150-1 to 150-6 are disposed in this order along a minus-x-direction corresponding to the semiconductor laser elements 104-1 to 104-6. A filter 108, a third lens 109, and an optical-fiber-holding unit 111 are disposed in this order along the z-direction in the package 101. An optical fiber 112 is fixed at the optical-fiber-holding unit 111. The optical fiber 112 extends to outside the package 101.

As shown in FIG. 2, steps are formed on the LD-height-adjusting plate 102 fixed in the package 101. The sub-mounts 103-1 to 103-6 are fixed on the LD-height-adjusting plate 102. The semiconductor laser elements 104-1 to 104-6 are mounted on the sub-mounts 103-1 to 103-6 respectively. The sub-mounts 103-1 to 103-6 assist heat-radiation from the semiconductor laser elements 104-1 to 104-6 mounted thereon. The semiconductor laser elements 104-1 to 104-6 emit laser lights at, for example, wavelengths of 900 nm to 1000 nm. Powers of the laser lights emitted from the semiconductor laser elements 104-1 to 104-6 are equal to or greater than 1 W, and further, for example, equal to or greater than 10 W. The lead pin 105 applies voltage, and injects electric current, to the semiconductor laser elements 104-1 to 104-6. The voltage to be applied may be constant or modulated.

The semiconductor laser elements 104-1 to 104-6 are disposed so that their heights differ from each other based on the steps of the LD-height-adjusting plate 102. The first lenses 106-1 to 106-6, the second lenses 107-1 to 107-6, and the mirrors 150-1 to 150-6 are disposed on the steps respectively. Each step has one semiconductor laser element corresponding to each ones of the first lenses 106-1 to 106-6, the second lenses 107-1 to 107-6, and the mirrors 150-1 to 150-6.

The first lenses 106-1 to 106-6 are cylindrical lenses condensing a light in the y-direction. Focal distances of the first lenses 106-1 to 106-6 are, for example, 0.3 mm. The second lenses 107-1 to 107-6 are cylindrical lens condensing lights in the x-direction that is orthogonal to the first lenses 106-1 to 106-6. Focal distances of the second lenses 107-1 to 107-6 are, for example, 10.5 mm. The first lenses 106-1 to 106-6 and the second lenses 107-1 to 107-6 condense laser lights emitted by the semiconductor laser elements 104-1 to 104-6 respectively. The mirrors 150-1 to 150-6 reflect the laser lights condensed by the first lenses 106-1 to 106-6 and the second lenses 107-1 to 107-6 to the filter 108's side.

The filter 108 is a low-pass filter transmitting lights at wavelengths of 900 nm to 1000 nm therethrough corresponding to the laser lights emitted by the semiconductor laser elements 104-1 to 104-6 and reflecting redundant lights incident from outside, for example, lights at wavelengths of 1060 nm to 1080 nm. The third lens 109 condenses the transmitted laser lights to an end surface of the optical fiber 112 and makes the condensed laser lights couple to the optical fiber 112. The focal distance of the third lens 109 is, for example, 10 mm. The laser lights incident into the optical fiber 112 are guided by the optical fiber 112. The optical fiber 112 may be a multi-mode optical fiber, for example, of which core diameter is 105 μm, or may be a single-mode optical fiber.

The optical-fiber-holding unit 111 fixes the optical fiber 112 at the position where the coupling efficiency for the laser light being condensed by the third lens 109 to the optical fiber 112 becomes the maximum.

Hereafter, an operation of the semiconductor laser module 100 will be explained. At first, a voltage is applied, and an electric current is injected, from the lead pin 105 to each of the semiconductor laser elements 104-1 to 104-6, then a laser light is emitted from each of the semiconductor laser elements 104-1 to 104-6 in the minus-x-direction. Each of the laser lights emitted from the semiconductor laser elements 104-1 to 104-6 is made an approximate collimated light by each of the first lenses 106-1 to 106-6 and each of the second lenses 107-1 to 107-6. More specifically, the laser light emitted from each of the semiconductor laser elements 104-1 to 104-6 is restrained by each of the first lenses 106-1 to 106-6 from dispersing in the y-direction and made an approximate collimated light in the y-direction. Then, the laser light is restrained by each of the second lenses 107-1 to 107-6 from dispersing in the x-direction and made an approximate collimated light in the x-direction.

The approximate collimated laser light is reflected by each of the mirrors 150-1 to 150-6. As shown in FIG. 2, herein each of the semiconductor laser elements 104-1 to 104-6 is disposed so that the heights thereof differ from each other by the steps. Therefore, the laser light is reflected by one, disposed at the same height as that of a corresponding one of the semiconductor laser elements 104-1 to 104-6, of the mirrors 150-1 to 150-6, disposed so as to differ in their heights from each other similarly by the steps, and then reflected so as to be in parallel with the z-direction that is the waveguide direction of the optical fiber 112. Hereby the laser light outputted from each semiconductor laser element is reflected by one, formed on an optical path of the laser light, of the mirrors 150-1 to 150-6, and is not transmitted through other mirrors. Such a step structure prevents production of unnecessary loss of the laser light.

Then, the laser light is condensed by the third lens 109 as a light-condensing portion, and is coupled to the optical fiber 112. The laser light coupled to the optical fiber 112 is guided, and then outputted to, outside the semiconductor laser module 100 by optical fiber 112. The filter 108 cutting unnecessary light entering from outside may be omitted.

Figure 3:
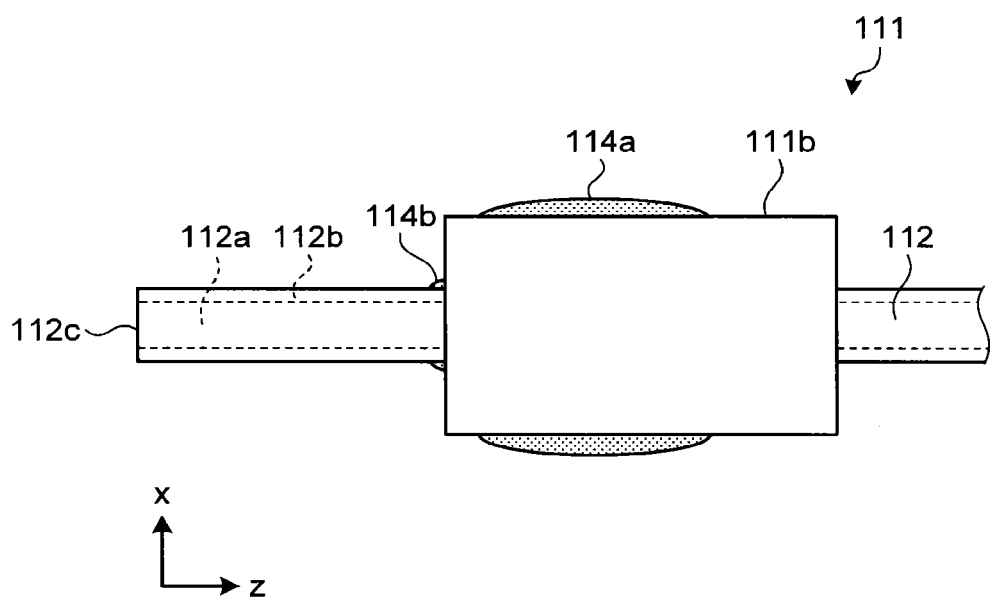
FIG. 3 is a schematic x-z plan view in which an optical-fiber-holding unit of the semiconductor laser module shown in FIG. 1 is enlarged.
Figure 4:
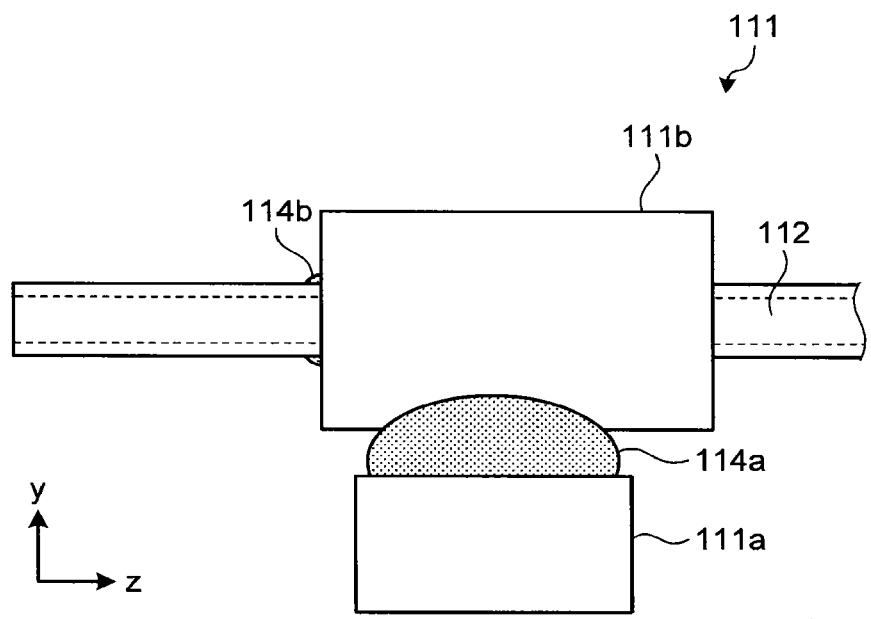
FIG. 4 is a schematic y-z plan view in which the optical-fiber-holding unit of the semiconductor laser module shown in FIG. 1 is enlarged.

Hereafter a configuration of the optical-fiber-holding unit 111 will be explained. FIG. 3 is a schematic x-z plan view in which an optical-fiber-holding unit of the semiconductor laser module shown in FIG. 1 is enlarged. FIG. 4 is a schematic y-z plan view in which the optical-fiber-holding unit of the semiconductor laser module shown in FIG. 1 is enlarged.

As shown in FIGS. 3 and 4, the optical-fiber-holding unit 111 includes a pedestal 111a, and a ferrule 111b and a fixing agents 114a and 114b, that are holding members. The pedestal 111a is fixed on the package 101. The ferrule 111b is fixed on the pedestal 111a with the fixing agent 114a. The ferrule 111b and the optical fiber 112 inserted therethrough are fixed by the fixing agent 114b. Hereby the optical-fiber-holding unit 111 holds the optical fiber 112. The optical fiber 112 includes a core 112a, a cladding 112b, and a light-incident side's end portion 112c into which a laser light is incident at a side facing the third lens 109.

It is preferable that the ferrule 111b be not melted by non-coupled light, which will be explained later, of the laser light, that the ferrule 111b be made of an inflammable material, and that an optical absorptivity to the laser light be equal to or less than 30%. It is preferable to use a material, for the ferrule 111b, of which heat resistance is equal to or greater than 500° C. such as, for example, metal, glass, and ceramics of which heat resistance is equal to or higher than 1000° C. For the purpose of preventing the ferrule 111b from being melted by the laser light, the ferrule 111b may be configured to include a reflection layer, of which reflectivity is equal to or greater than 70% and more preferably equal to or greater than 90% at a wavelength of the laser light, at the third lens 109's side (the end portion 112c's side). The reflection layer made of material as such may be, for example, a metal layer or a dielectric multi-layer. As described later, it may be configured to cover an outer surface including the third lens 109's side of the ferrule 111b with metal or the like. The fixing agent 114a and the fixing agent 114b are configured by, for example, an organic adhesive such as ultraviolet curable resin and thermosetting resin, solder, low melting glass, or inorganic adhesive.

Epoxy resin and urethane-based resin are used preferably because of their handleabilities. Heat resistance for the epoxy resin and the urethane-based resin are approximately 100° C.

Although the laser light herein is condensed by the third lens 109 as a light-condensing portion and is coupled to the optical fiber 112, a part of the laser light not coupled to the optical fiber 112 becomes a non-coupled light. For reasons of non-coupled light being produced, one case is that a part of the laser light is not introduced into the core 112a of the optical fiber 112 because a spot diameter, of the laser light condensed by the third lens 109, that is greater than a core diameter of the optical fiber 112, and another case is that the laser light once introduced into the core 112a of the optical fiber 112 is not subjected to total reflection at an interface between the core 112a and the cladding 112b and thus emitted as a leakage light from a side surface of the optical fiber 112. In the semiconductor laser module 100 according to Embodiment 1, the core diameter of the optical fiber 112 is 105 μm, a laser light's field condensed by the third lens 109 is of a shape of six overridden ovals, and a major axis of the oval is 100 μm and a minor axis is approximately 30 μm. Therefore, the non-coupled light is considered to be produced mainly by the leakage light because the spot diameter of the laser light condensed by the third lens 109 is smaller than the core diameter of the optical fiber 112.

Figure 5:
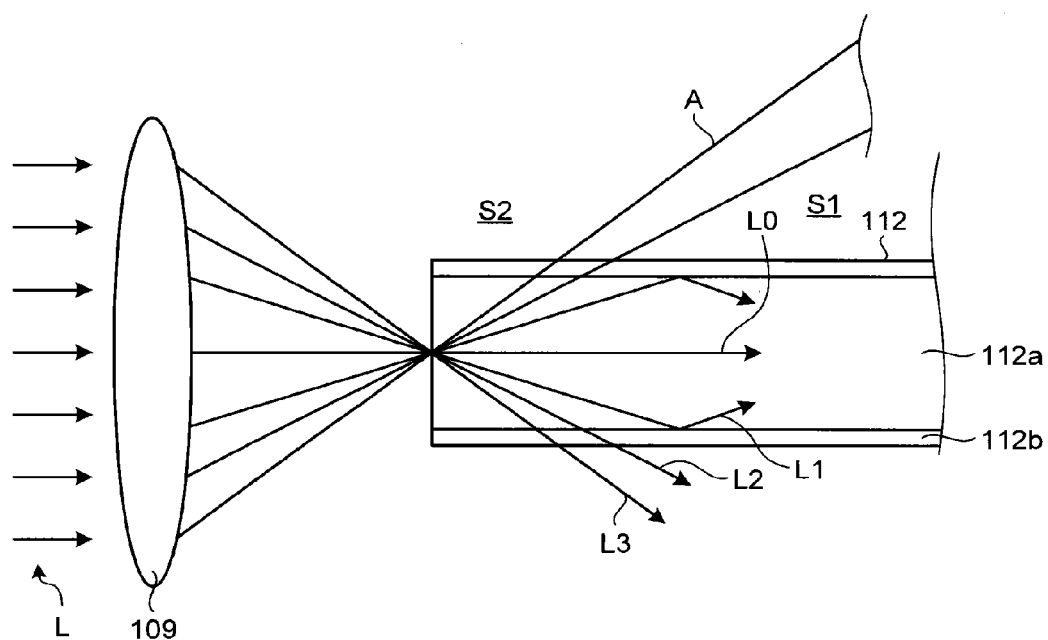
FIG. 5 is a view for explaining a leakage light produced when a laser light is coupled to the optical fiber.

FIG. 5 is a view for explaining a leakage light produced when a laser light is coupled to the optical fiber. As shown in FIG. 5, a laser light L being incident to the third lens 109 from a left hand side of the drawing is condensed by the third lens 109 and introduced into the core 112a of the optical fiber 112. A laser light L0 of the introduced laser light is coupled to the optical fiber 112 and guided in the center of the core 112a. A laser light L1 is subjected to total reflection at the interface between the core 112a and the cladding 112b and coupled to the optical fiber 112. However, some laser light like a laser light L2 and a laser light L3 is not reflected at the interface between the core 112a and the cladding 112b, not confined in the core 112a, but emitted to outside the optical fiber 112 as a leakage light. Leakage light A indicates a leakage light such as the laser lights L2 and L3, and an area through which the leakage light A passes is referred to a leakage light's pathway area. Although the laser lights L0 to L3 are actually subjected to refraction at each interface of each optical path, each optical path is a straight line in FIG. 5 for simple illustration.

Therefore, very little leakage light A is emitted to outside the optical fiber 112 and the leakage light is sufficiently weak in an area, of which angle is sufficiently small relative to the waveguide direction of the optical fiber 112 and to which the incident laser light is coupled, of the optical fiber 112. This area is referred to as an inner-fixing area S1. The leakage light is sufficiently weak at an area of which angle is sufficiently large relative to the waveguide direction of the optical fiber 112. This area is referred to as an outer fixing area S2. As described above, a fixing area, in which the leakage light is sufficiently weak, that is, the power of the leakage light is low, includes the inner-fixing area and the outer fixing area.

Herein a sufficiently weak leakage light indicates an intensity of the leakage light in an x-y plane is less than 130 W/mm$^2$, and more preferably less than 100 W/mm$^2$.

In a case where a field of light incident into the optical fiber 112 is oval, the power of the leakage light increases relative to the major axis direction (in which the diameter becomes the longest in the field of the light). If the semiconductor laser elements increase in number, it is considered that the diameters of the minor axis direction and the major axis direction of the field may be almost the same, or the diameter in the minor axis direction becomes longer than that in the major axis direction. However, the diameter of the minor axis direction changes very little even if the driving current for the semiconductor laser element changes, the power of the leakage light can be reduced sufficiently by adequate design. On the other hand, since the diameter of the major axis direction may change sometimes if the driving current for the semiconductor laser element changes, the intensity of the leakage light in the major axis direction must be considered in a case of using many semiconductor laser elements.

If the leakage light produced as such is irradiated to the fixing agent made of resin, solder or the like, the fixing agent may be melted or damaged sometimes. A high power semiconductor laser module of, for example, an output of equal to or greater than 1 W tends to be subjected to such a phenomenon. Moreover, since the optical power of the leakage light increases if the outputs of the semiconductor laser elements 104-1 to 104-6 are higher, the fixing agent tends to be melted or damaged more easily.

Figure 6:
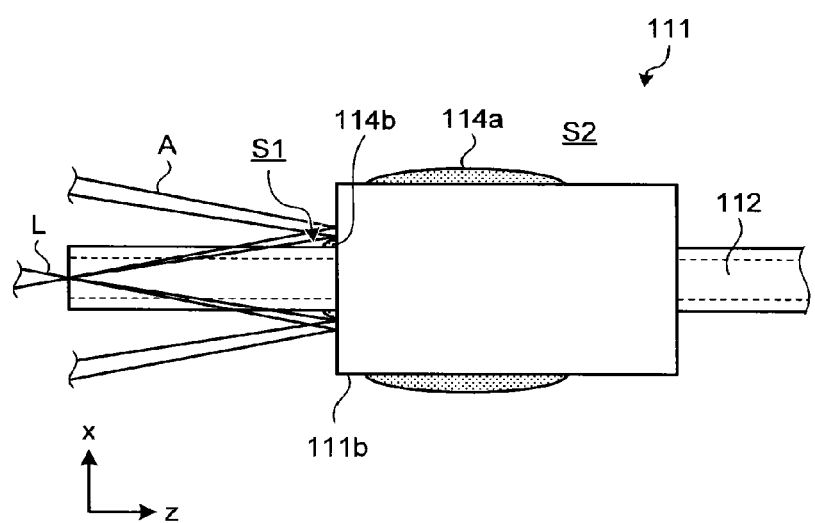
FIG. 6 is a view showing the leakage light leaking from the optical-fiber-holding unit of the semiconductor laser module shown in FIG. 1.

By contrast, as shown in FIG. 6, in the semiconductor laser module 100 according to Embodiment 1, the fixing agent 114a is formed in the outer fixing area S2, and the fixing agent 114b is formed in the inner fixing area S1 relative to the leakage light's pathway area through which the leakage light A passes, in the x-axis direction corresponding to the major axis direction of the oval of an optical field of the laser light L incident into the optical fiber 112. Moreover, the leakage light A is reflected at a laser-light-L-incident side's end surface of the ferrule 111b. Hereby since the leakage lights irradiated to the fixing agent 114a and the fixing agent 114b are sufficiently weak, the fixing agent 114a and the fixing agent 114b are not melted or damaged. Therefore, the semiconductor laser module 100 according to Embodiment 1 becomes a highly reliable semiconductor laser module when being operated at higher output. If the semiconductor laser elements 104-1 to 104-6 are of high power, for example, a total output of equal to or greater than 10 W, the intensity of the leakage light is equal to or greater than 130 W/mm² sometimes, and therefore the fixing agent is melted or damaged sometimes when the leakage light is irradiated. Moreover, if the semiconductor laser elements 104-1 to 104-6 are of high power, for example, a total output of equal to or greater than 30 W, since the intensity of the leakage light tends to be equal to or greater than 130 W/mm², an effect of preventing the fixing agent 114a and the fixing agent 114b according to Embodiment 1 from being melted or damaged is remarkable.

Figure 7:
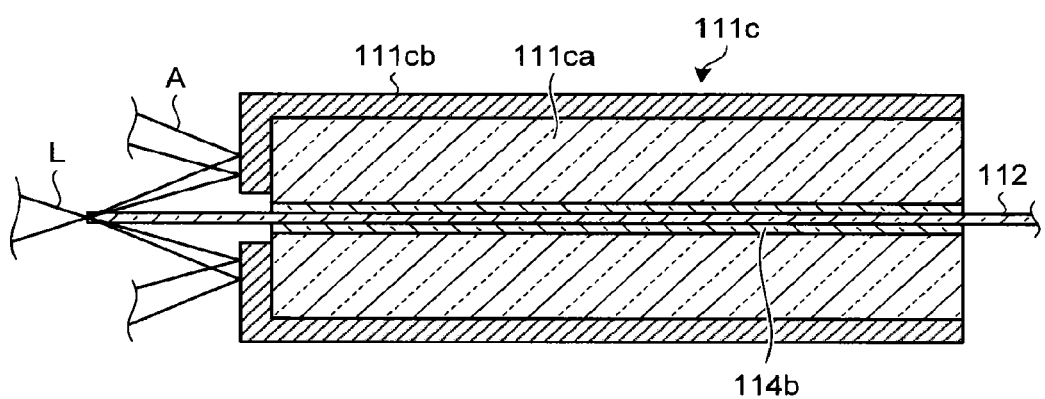
FIG. 7 is a view showing a modified example of a ferrule.

FIG. 7 is a view showing a modified example of a ferrule. As described previously, the ferrule 111c includes a ferrule body 111ca made of glass and a protection member 111cb covering an outer surface, including the laser-light-L-incident side's end surface, of the ferrule body 111ca and being made of a pipe-shaped metal. The optical fiber 112 is bonded inside an insertion hole of the ferrule body 111ca with the fixing agent 114b. Since the leakage light A as a non-coupled light is reflected by the protection member 111cb configuring the laser-light-L-incident side's end surface of the ferrule 111c in the ferrule 111c having such a configuration, the leakage light irradiated to the fixing agent 114b is sufficiently weak, and thus irradiated very little. The ferrule body 111ca made of glass can be produced in better accuracy than, for example, a metal ferrule. Therefore, since the insertion hole for the optical fiber 112 can be produced in good accuracy, a gap between the optical fiber 112 and the insertion hole can be narrowed. As a result, the amount of the fixing agent 114B to be used can be limited. Since it is configured to cover the outer surface of the ferrule body 111ca with the protection member 111cb made of metal, an effect is obtained that it is easy to attach a structure for radiating heat produced by the leakage light A irradiated to the ferrule 111c.

Hereafter the fixing area, from which the leakage light is sufficiently weak, will be explained in further detail.

Figure 8:
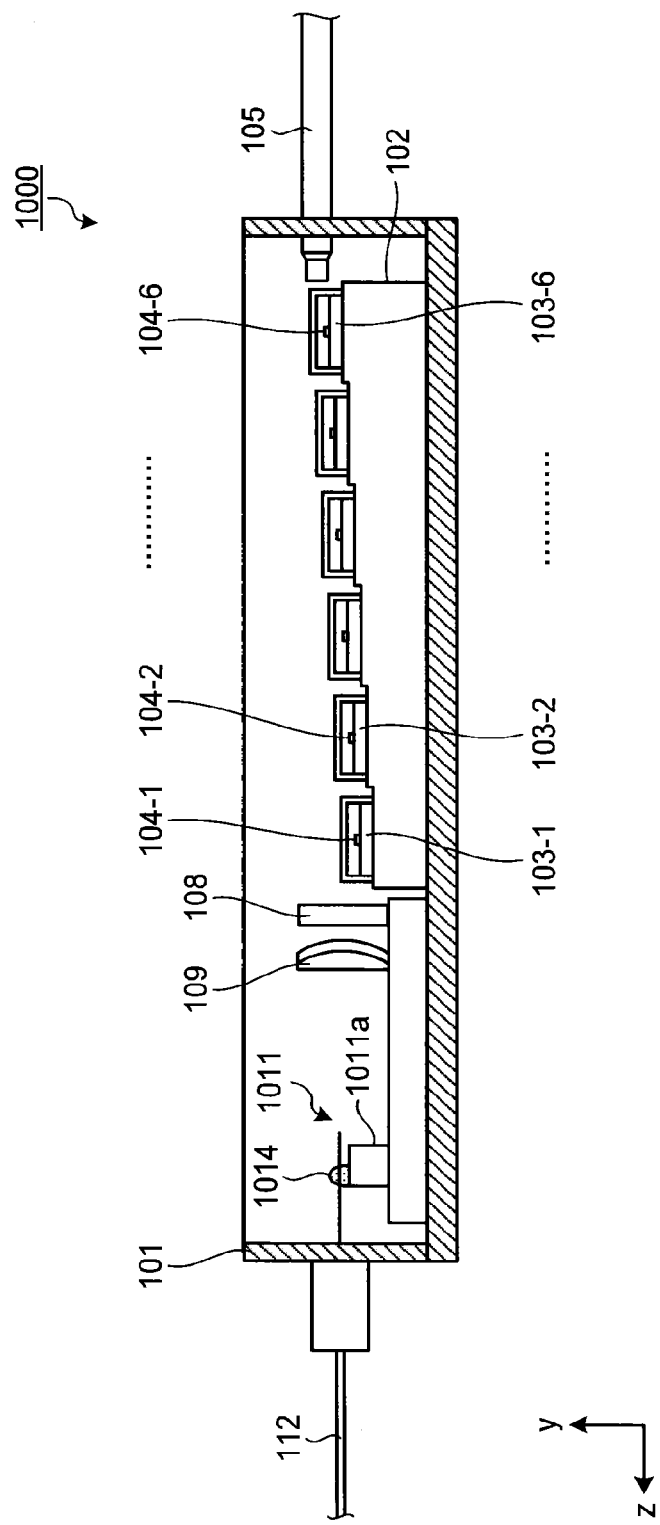
FIG. 8 is a view for explaining a semiconductor laser module for experiment.

As shown in FIG. 8, in the semiconductor laser module according to Embodiment 1, a semiconductor laser module 1000 for experiment and for use in explanation hereafter, is configured to have an optical-fiber-holding unit 1011 fixing the optical fiber 112, not by using a ferrule, but with a fixing agent 1014 directly on a planar pedestal 1011a, and other configurations are the same as those of the semiconductor laser module 100.

An output of the laser light emitted from each of the six semiconductor laser elements 104-1 to 104-6 was 11 W at maximum at each element. Wavelengths of the laser lights emitted from the respective semiconductor laser elements 104-1 to 104-6 were identical at 915 nm. A focal distance of each of the first lenses 106-1 to 106-6 was 0.3 mm, a focal distance of each of the second lenses 107-1 to 107-6 was 10.5 mm, and a focal distance of the third lens 109 was 10 mm. The optical fiber 112 was a multi-mode optical fiber of which core diameter was 105 μm and of which NA was 0.15. The fixing agent 1014 was epoxy resin. The fixing agent 1014 was provided at a position, at an interval of 3 mm from an end, to which the leakage light from the optical fiber 112 is irradiated and at which the leakage light's power is intense.

Figure 9:
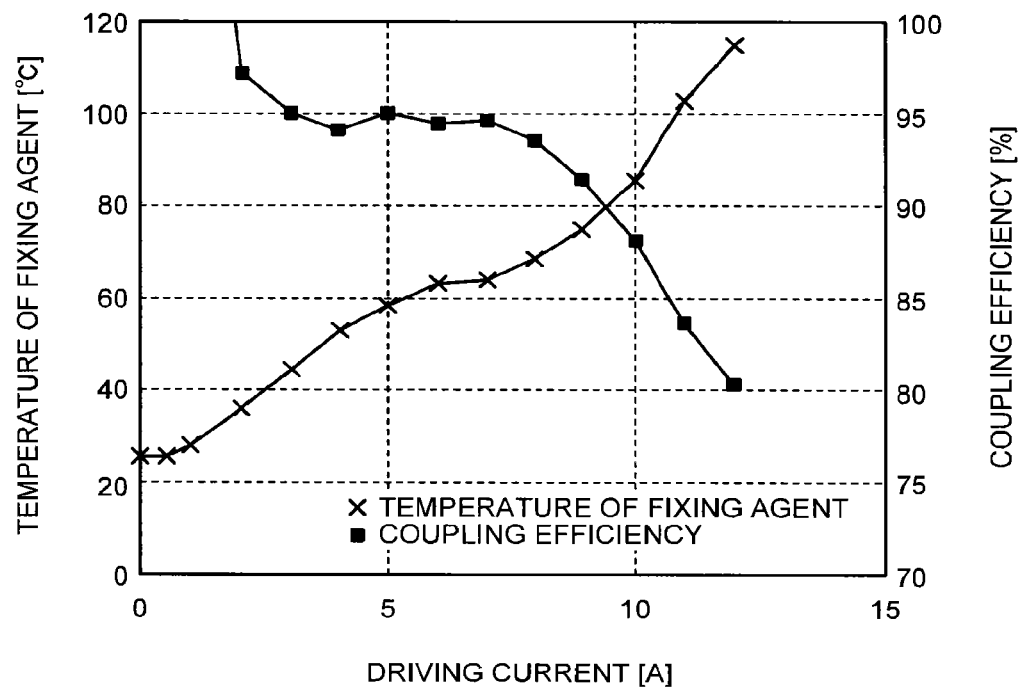
FIG. 9 is a view showing a relationship among a driving current, coupling efficiency, and temperature of the fixing agent.

To start with, it was measured as to how a coupling efficiency of the laser light coupled to the optical fiber 112 and a temperature of the fixing agent 1014 changed when a driving current was increased in the present semiconductor laser module 1000 to increase an output of the semiconductor laser module 1000. FIG. 9 is a view showing a relationship among a driving current, coupling efficiency, and temperature of the fixing agent. As shown in FIG. 9, when the driving current is increased, the coupling efficiency decreases, and the temperature of the fixing agent increases. A reason for this is considered that, when the driving current is increased, the optical power of the leakage light increases and the temperature of the epoxy resin as the fixing agent also increases, thus the epoxy resin is softened and deformed, and the coupling efficiency decreases. For example, in a case where the driving current is 12 A, the coupling efficiency decreases to approximately 80% and the temperature of the fixing agent is equal to or higher than 100° C. The fixing agent herein melts sometimes because the epoxy resin and the urethane-based resin melt at approximately 100° C.

Herein, for example, in a case where laser lights, each of which optical intensity is 11 W, are emitted from the semiconductor laser elements 104-1 to 104-6 and thus a laser light is incident into the optical fiber 112 by a total of 66 W, the coupling efficiency is 85%. That is, 56 W of the laser light is coupled to the optical fiber 112 and the rest of, an approximately 10 W of, the laser light is emitted from a side surface of the optical fiber 112 as the leakage light and as a non-coupled light. As described above, if the semiconductor laser module is high in its output, the leakage light is also very intense. When the semiconductor laser module is used under the condition as such, reliability is deteriorated remarkably.

The remarkable deterioration as such of the reliability tends to occur in a case where the intensity of the leakage light at the position where the fixing agent 1014 is provided is equal to or greater than 130 W/mm². This problem occurs sometimes in a case where the laser light incident into the optical fiber 112 is equal to or greater than 10 W, and the intensity of the leakage light tends to be equal to or greater than 130 W/mm² in a case where in particular the power of the laser light is equal to or greater than 30 W.

Figure 10:
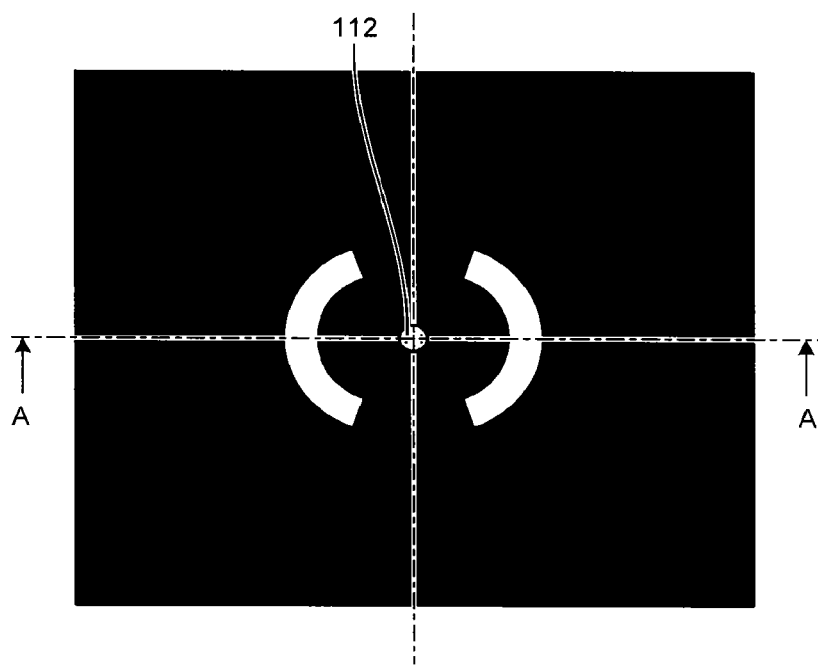
FIG. 10 is a schematic view showing the result of simulating a power profile of the leakage light at the position by 3 mm from the tip of the optical fiber's lens side.

Then, it was simulated as to how and which areas the leakage light passed after being emitted from the side surface of the optical fiber 112. FIG. 10 is a schematic view showing the result of simulating a power profile of the leakage light at the position at an interval of 3 mm from the tip (that is light-incident-side's end portion) of the optical fiber 112 of the lens (third lens 109) side. FIG. 10 shows the result of simulating intensity power profile of the leakage light in a case where the coupling efficiency is 96% and a power of the non-coupled light is 0.15 W. One side of FIG. 10 is 2 mm in length, and the optical fiber 112 is disposed at the center of the drawing. White-colored portions in the drawing indicate higher power of the light. Herein FIG. 10 illustrates an area in which leakage light is intense in a horizontal direction of the drawing, that is, the x-direction, but not in a vertical direction of the drawing, that is, the y-direction. It is caused by a field of the light incident into the optical fiber 112 being oval which has an major axis in the x-direction under the condition for the present semiconductor laser module 1000. The oval is, for example, 100 μm in major axis and approximately 30 μm in minor axis, and the major axis and the minor axis are smaller than the core diameter of the optical fiber. In a case where the field of the light incident into the optical fiber is oval as such, since the power of the leakage light for the major axis direction (in which the diameter is the longest in the field of the light) increases, it is necessary to provide the fixing agent in an area in which the power of the leakage light is weak, such as a position or the like which is more distant from the optical fiber than the area through which the leakage light passes (and in which the intensity of the leakage light is intense).

Figure 11:
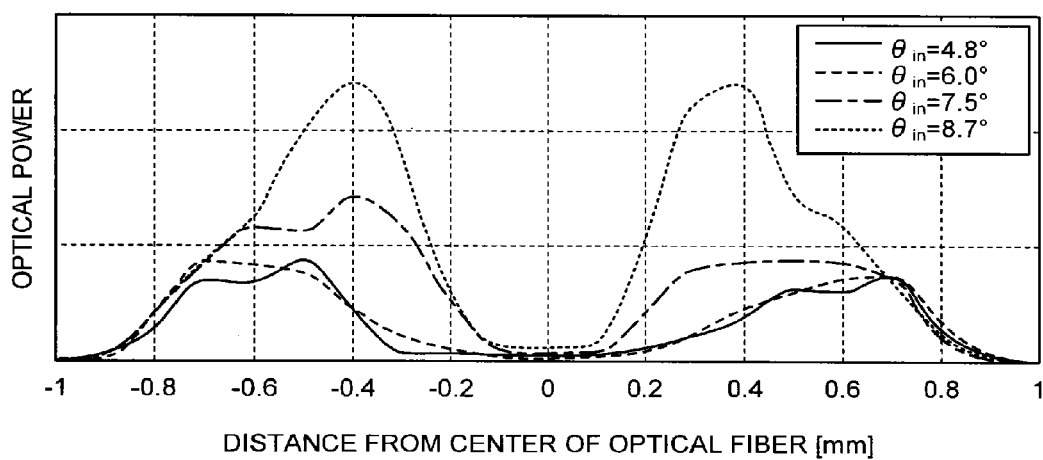
FIG. 11 is a view showing optical power at a cross sectional view taken from line A-A in FIG. 9.

FIG. 11 is a view showing optical power at a cross sectional view taken from line A-A in FIG. 10. As shown in FIG. 11, an area where the power of the leakage light is sufficiently weak in the major axis direction of the field of the light incident into the optical fiber is at a position at an interval of 3 mm from an end, into which the light is incident, of the optical fiber 112 and outside an interval of 0.8 mm from the center of the optical fiber 112. This area is the outer fixing area. The core diameter of the optical fiber 112 is 105 μm and is sufficiently small relative to 0.8 mm. Therefore, the area in which the optical power is intense in the drawing indicates the leakage light emitted from the optical fiber 112. Moreover, FIG. 11 illustrates an area in which the power of the leakage light is sufficiently weak in the vicinity of the center. This is the inner fixing area.

After that, a leakage light's pathway area (in which the power of the leakage light is intense) was measured in further detail for the present semiconductor laser module 1000. In this state, it was configured that laser lights, each optical power of which was 11 W, were emitted from the semiconductor laser elements 104-1 to 104-6 and a laser light was supposed to be incident into the optical fiber by a total of 66 W. Approximately 80 to 85% of the laser light was coupled to the optical fiber 112 and the output of the light emitted from the optical fiber 112 was adjusted to be 50 W. It was measured as to whether the fixing agent 1014 would be melted or damaged and as to whether the output of the laser light emitted from the optical fiber 112 would be reduced in a case where the semiconductor laser module 1000 was driven continuously for one hour under the above-described condition.

Figure 12:
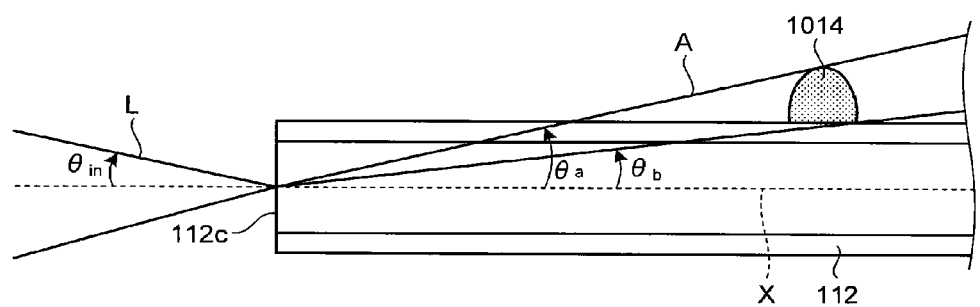
FIG. 12 is a view for explaining a method of measuring an area through which the leakage light passes.

FIG. 12 is a view for explaining a method of measuring an area through which the leakage light passes. FIG. 12 illustrates an angle $\theta_{in}$, that is an (incident) angle defined by a laser light L incident into the optical fiber 112 relative to a center axis x of an optical fiber extending in a waveguide direction of the optical fiber 112 in a major axis direction (vertical direction in the drawing) of a field of the laser light L incident into the optical fiber 112. An angle $\theta_a$ is an angle defined by the cross-sectional center of the end portion 112c of a light-condensing portion's side of the optical fiber 112 and outside an area, in which the leakage light A passes through the fixing agent 1014, relative to a waveguide direction of the optical fiber 112 (center axis x) in the major axis direction of an optical field of the laser light L. An angle $\theta_b$ is an angle defined by the cross-sectional center of the end portion 112c of a light-condensing portion's side of the optical fiber 112 and inside an area, in which the light passes through the fixing agent 1014.

Figure 13:
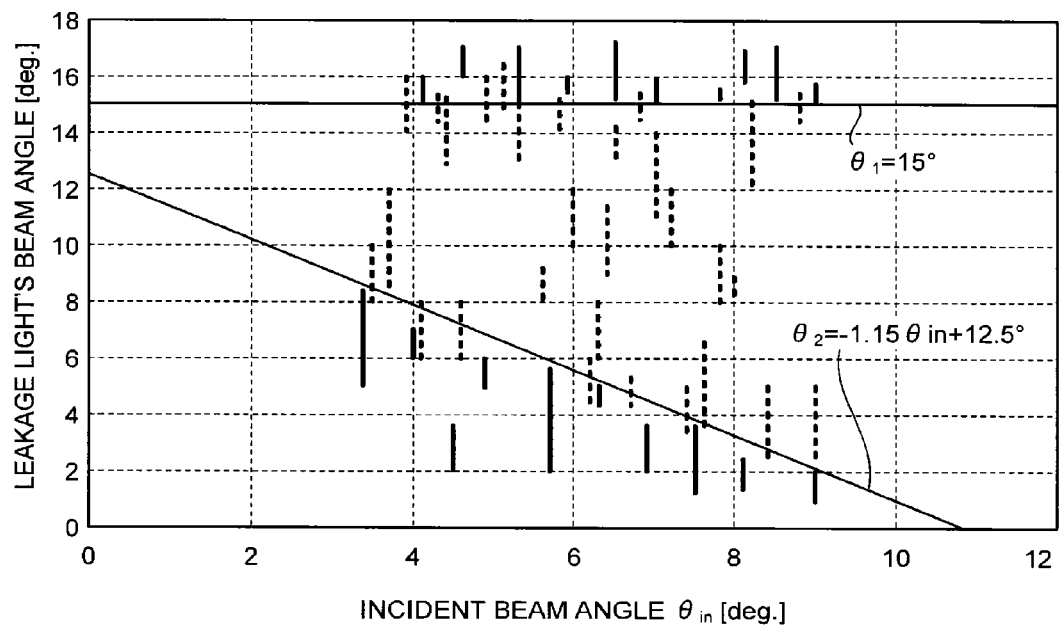
FIG. 13 is a view showing a result of measuring the area through which the leakage light passes.

Then fifty semiconductor laser modules 1000 were produced in which $\theta_a$ and $\theta_b$ were varied under the above described condition, and a test was conducted as to whether or not the fixing agent 1014 would be damaged. Table 1 and FIG. 13 show a result of measuring the area through which the leakage light passes.

TABLE 1

| NO. | $\theta_{in}$ | $\theta_a$ | $\theta_b$ | RESULTS |
|---|---|---|---|---|
| 1 | 3.4 | 8.4 | 5.0 | GOOD |
| 2 | 4.0 | 7.0 | 6.0 | GOOD |
| 3 | 4.5 | 3.6 | 2.0 | GOOD |
| 4 | 4.9 | 6.0 | 5.0 | GOOD |
| 5 | 5.7 | 5.6 | 2.0 | GOOD |
| 6 | 6.3 | 5.0 | 4.3 | GOOD |
| 7 | 6.9 | 3.6 | 2.0 | GOOD |
| 8 | 7.5 | 3.6 | 1.3 | GOOD |
| 9 | 8.1 | 1.4 | 2.4 | GOOD |
| 10 | 9.0 | 2.0 | 1.0 | GOOD |
| 11 | 3.5 | 10.0 | 8.0 | POOR |
| 12 | 3.7 | 12.0 | 8.4 | POOR |
| 13 | 3.9 | 16.0 | 14.0 | POOR |
| 14 | 4.1 | 8.0 | 6.0 | POOR |
| 15 | 4.3 | 15.3 | 14.5 | POOR |
| 16 | 4.4 | 15.2 | 13.0 | POOR |
| 17 | 4.6 | 8.0 | 6.0 | POOR |
| 18 | 4.9 | 16.0 | 14.4 | POOR |
| 19 | 5.1 | 16.4 | 14.9 | POOR |
| 20 | 5.3 | 15.0 | 13.0 | POOR |
| 21 | 5.6 | 9.2 | 8.0 | POOR |
| 22 | 5.8 | 15.2 | 14.0 | POOR |
| 23 | 6.0 | 12.0 | 10.0 | POOR |
| 24 | 6.2 | 6.0 | 4.5 | POOR |
| 25 | 6.3 | 8.0 | 6.0 | POOR |
| 26 | 6.4 | 11.4 | 9.0 | POOR |
| 27 | 6.5 | 14.2 | 13.0 | POOR |
| 28 | 6.7 | 5.3 | 4.4 | POOR |
| 29 | 6.8 | 15.4 | 14.6 | POOR |
| 30 | 7.0 | 14.0 | 11.0 | POOR |
| 31 | 7.2 | 12.0 | 10.0 | POOR |
| 32 | 7.4 | 5.0 | 3.4 | POOR |
| 33 | 7.6 | 6.6 | 3.6 | POOR |
| 34 | 7.8 | 10.0 | 8.0 | POOR |
| 35 | 8.0 | 8.9 | 8.0 | POOR |
| 36 | 8.2 | 15.1 | 12.0 | POOR |
| 37 | 8.4 | 5.0 | 2.6 | POOR |

TABLE 1-continued

| NO. | $\theta_{in}$ | $\theta_a$ | $\theta_b$ | RESULTS |
|---|---|---|---|---|
| 38 | 8.5 | 17.0 | 15.4 | POOR |
| 39 | 8.8 | 15.4 | 14.4 | POOR |
| 40 | 9.0 | 5.0 | 2.4 | POOR |
| 41 | 4.1 | 16.0 | 15.1 | GOOD |
| 42 | 4.6 | 17.0 | 16.0 | GOOD |
| 43 | 5.3 | 17.0 | 15.1 | GOOD |
| 44 | 5.9 | 16.0 | 15.4 | GOOD |
| 45 | 6.5 | 17.2 | 15.2 | GOOD |
| 46 | 7.0 | 15.9 | 15.1 | GOOD |
| 47 | 7.8 | 15.5 | 15.2 | GOOD |
| 48 | 8.1 | 16.9 | 15.8 | GOOD |
| 49 | 8.5 | 17.0 | 15.2 | GOOD |
| 50 | 9.0 | 15.7 | 15.1 | GOOD |

Table 1 shows, from its left hand side, number of each semiconductor laser module 1000, $\theta_{in}$, $\theta_a$, $\theta_b$, and a result of the test. $\theta_a$ and $\theta_b$ were obtained by measuring a relationship of positions of the fixing agent 1014 and the optical fiber 112 and by converting the relationship to an angle. The results of the test were described as "Good" if the fixing agent 1014 was not damaged and as "Poor" if the fixing agent 1014 was damaged. Moreover, the results shown in Table 1 are illustrated in FIG. 13 in which the horizontal axis indicates an angle $\theta_{in}$ of an incident light and a vertical axis indicates an area sandwiched between $\theta_a$ and $\theta_b$ in each test, that is the area in which the leakage light is irradiated to the fixing agent 1014. In FIG. 13, a solid line indicates a case where the fixing agent 1014 corresponding to "Good" in Table 1 was not damaged, and a broken line indicates a case where the fixing agent 1014 corresponding to "Poor" in Table 1 was damaged. It is considered that, in this test, the fixing agent 1014 will be damaged if the leakage light is irradiated to only a part of the fixing agent 1014. Therefore, an area including at least a case where no fixing agent 1014 was damaged can be regarded as an area in which the leakage light is sufficiently weak. By obtaining an area in which the leakage light is sufficiently weak in the major axis direction of the field of the light incident into the optical fiber 112 from FIG. 13, it is understood that the fixing area in which the leakage light is sufficiently weak includes an area defined by a cross-sectional center of the end portion 112c at a light-condensing portion's side of the optical fiber 112 and outside the angle $\theta_1=15°$, that has an angle of equal to or greater than 15° relative to the center axis x of the optical fiber 112 (outer fixing area), and an area defined by the cross-sectional center of the end portion 112c at the light-condensing portion's side of the optical fiber 112 and inside the angle $\theta_2$, that has an angle of $\theta_2$ equal to or less than $-1.15\theta_{in}+12.5°$ relative to the center axis x of the optical fiber 112 (inner fixing area).

Figure 14:
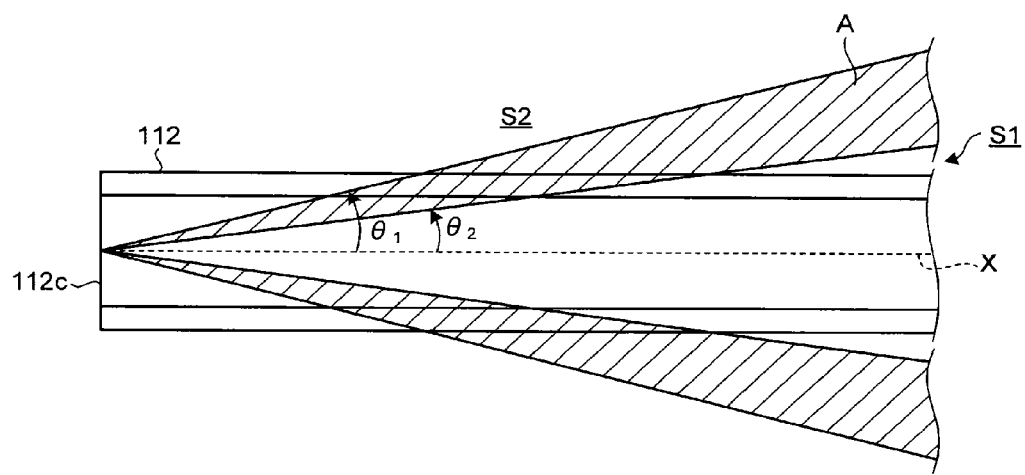
FIG. 14 is a view for explaining an area to which the leakage light is radiated.

FIG. 14 is a view for explaining an area to which the leakage light is radiated. According to the test, and as shown in FIG. 14, the leakage light's pathway area through which the leakage light A passes is a hatched area between angle $\theta_1$ and angle $\theta_2$. By contrast, the area in which the leakage light A is sufficiently weak includes the outer fixing area S2 outside the angle $\theta_1$ and the inner fixing area S1 inside the angle $\theta_2$. Among these, since the outer fixing area S2 is the area that is great in angle relative to the center axis x of the optical fiber 112, the leakage light A does not pass through the outer fixing area S2. On the other hand, since the inner fixing area is an area of which angle relative to the center axis x of the optical fiber 112 is small, the incident light is coupled to the optical fiber 112 and no leakage light is emitted to the area, therefore the leakage light A does not pass through the inner fixing area. Therefore, by forming the fixing agent at at least one of the outer fixing area S2 and the inner fixing area S1 as the fixing areas, the leakage light irradiated to the fixing agent can be reduced sufficiently to a degree that the fixing agent is not melted or damaged. In this state, a highly reliable semiconductor laser module can be achieved even under an extremely high output condition of the leakage light such as equal to or greater than 1 W, and 10 W, the effect of the present invention can be exerted sufficiently.

EXAMPLES

Hereafter examples according to the present invention will be explained. The semiconductor laser module according to an example has the configuration of the semiconductor laser module 100 according to Embodiment 1, in which the fixing agents 114a and 114b are formed in the outer fixing area S2 and the inner fixing area S1 as shown in FIG. 6 unlike the configuration of the semiconductor laser module 1000 for experiment shown in FIG. 8. The power of outputted light, focal distance, and material or the like of each element are the same as those of the semiconductor laser module for experiment. A semiconductor laser module according to such example was produced actually, and 100 hours of continuous driving was conducted in which an output of the laser light emitted from the optical fiber was at 30 W. In this state, an increase in temperature and decrease in coupling efficiency shown in FIG. 9 were not observed. Therefore, the semiconductor laser module according to the present example was proved to be a highly reliable semiconductor laser module even when being operated at higher output.

The above-described optical-fiber-holding unit 111 configured to hold the optical fiber 112 by using the fixing agent 114a and the fixing agent 114b may be alternatively of a configuration of using only one of the fixing agent 114a and the fixing agent 114b. For example, the optical-fiber-holding unit 111 may be of a configuration providing only the fixing agent 114b but not using the fixing agent 114a, sandwiching the ferrule 111b between the pedestal 111a and a metal plate, and then fixing it with screws. That is, it may be configured that the fixing agent 114b is disposed at only the inner fixing area S1. Alternatively, it may be configured that only the fixing agent 114a is provided but the fixing agent 114b is not used, the inner periphery of the ferrule 111b and the outer periphery of the optical fiber 112 are machined to align with each other, and the optical fiber 112 does not move even if the fixing agent 114B is not used. That is, it may be configured that the fixing agent 114a and the optical fiber 112 are separated, and the fixing agent 114a is formed only at the outer fixing area S2. As described above, in a case of configuring the optical-fiber-fixing member, the fixing agent may be configured to be disposed at only one of the inner fixing area and the outer fixing area.

Modified Example 1 of Optical-Fiber-Holding Unit

Hereafter, as a modified example of the optical-fiber-holding unit, an optical-fiber-holding unit in which the fixing agent is disposed at only the inner fixing area as described above will be explained.

Figure 15A:
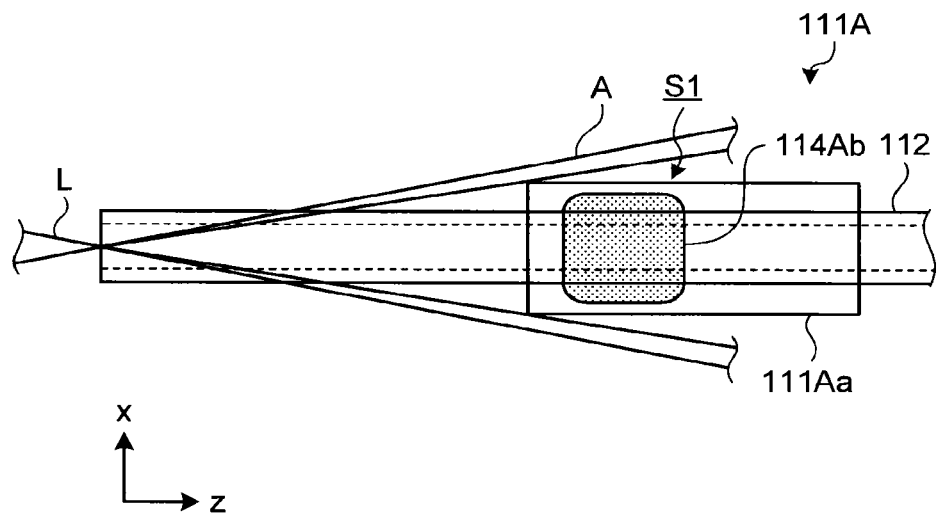
FIG. 15A is a schematic x-z plan view of Modified Example 1 of the optical-fiber-holding unit.

FIG. 15A is a schematic x-z plan view of Modified Example 1 of the optical-fiber-holding unit. An optical-fiber-holding unit 111A can be used to replace the optical-fiber-holding unit 111 of the semiconductor laser module 100 according to Embodiment 1.

The optical-fiber-holding unit 111A is provided with a pedestal 111Aa and a fixing agent 114Ab. The optical-fiber-holding unit 111A holds the optical fiber 112 with the fixing agent 114Ab bonding and fixing the optical fiber 112 to the pedestal 111Aa. The fixing agent 114Ab and the fixing agent 114b are made of a similar material.

Since the fixing agent 114Ab of the optical-fiber-holding unit 111A is provided at the inner fixing area S1, the leakage light A produced when the laser light L is incident into the optical fiber 112 is not supposed to be irradiated to the fixing agent 114Ab. Therefore, the semiconductor laser module 100 provided with the optical-fiber-holding unit 111A is a highly reliable semiconductor laser module even when being operated at higher output.

In order to provide the fixing agent 114Ab at the inner fixing area S1, for example, a pedestal shown below is suitable.

Figure 15B:
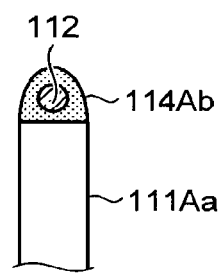
FIG. 15B is a view showing a modified example of a pedestal.
Figure 15C:
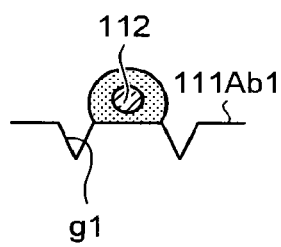
FIG. 15C is a view showing a modified example of the pedestal.
Figure 15D:
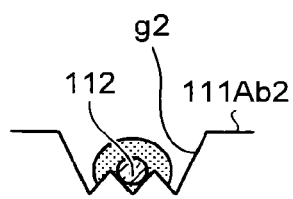
FIG. 15D is a view showing a modified example of the pedestal.

FIGS. 15B, 15C, and 15D are views showing modified examples of the pedestal. A modified example shown in FIG. 15B is configured to be capable of providing the fixing agent 114Ab at the inner fixing area S1 easily by narrowing the width of the pedestal 111Aa and restraining the fixing agent 114Ab from overflowing to an area through which the leakage light A passes. A pedestal 111Ab1 shown in FIG. 15C is configured to have grooves g1 provided at both sides of the fixing agent 114Ab so that the fixing agent 114Ab is provided at the inner fixing area S1 easily and is restrained from overflowing to the area through which the leakage light A passes. A pedestal 111Ab2 shown in FIG. 15D is configured so that the fixing agent 114Ab is provided at the inner fixing area S1 easily and is restrained from overflowing to the area through which the leakage light A passes by disposing the optical fiber 112 and the fixing agent 114Ab in a groove g2 for accommodating the optical fiber 112.

Embodiment 2

Figure 16:
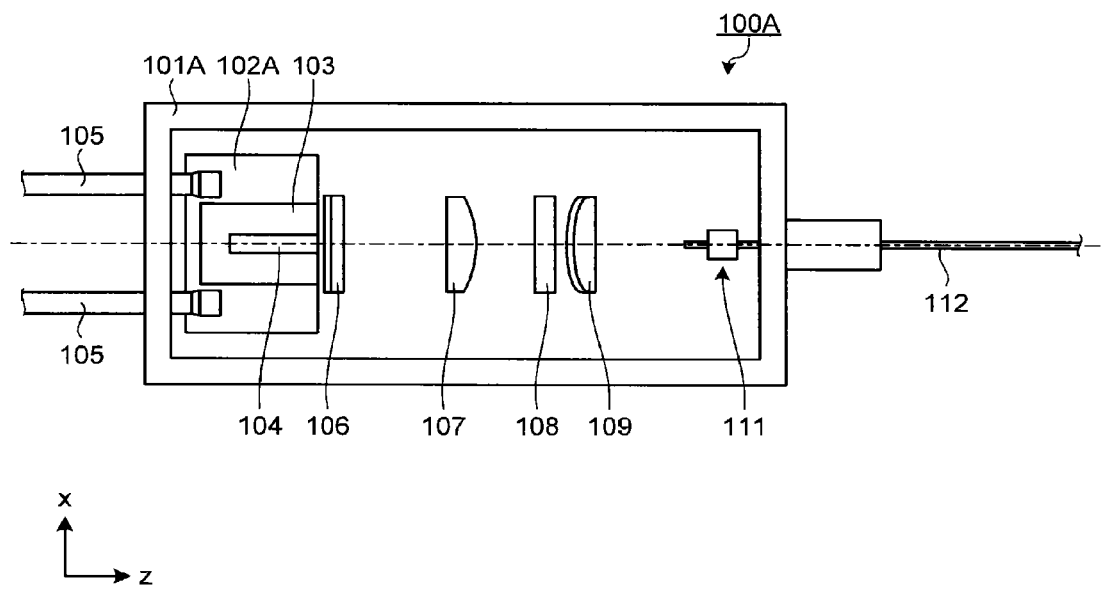
FIG. 16 is a schematic plan view of a semiconductor laser module according to Embodiment 2 of the present invention.
Figure 17:
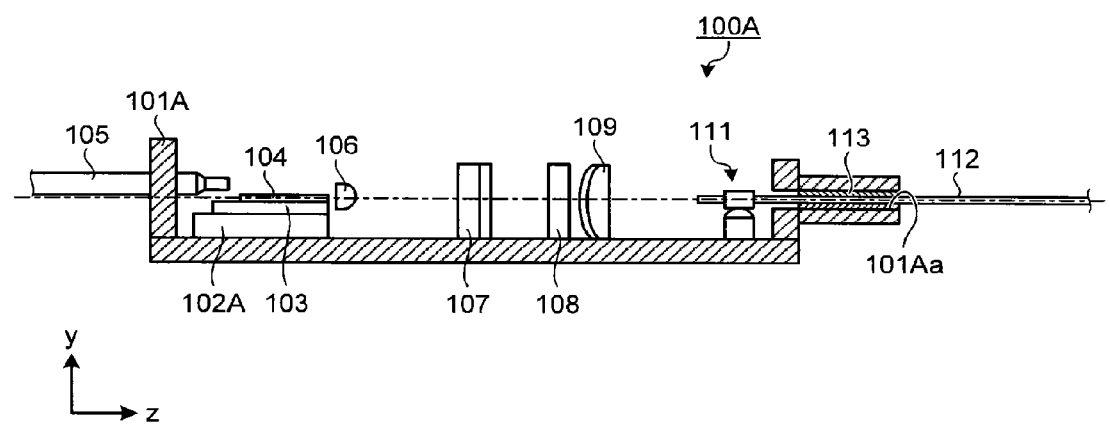
FIG. 17 is a schematic partially cutout view of the semiconductor laser module shown in FIG. 16.

FIG. 16 is a schematic plan view of a semiconductor laser module according to Embodiment 2 of the present invention. FIG. 17 is a schematic partially cutout view of the semiconductor laser module shown in FIG. 16. In FIGS. 16 and 17, an upper lid of the package is omitted. As shown in FIGS. 16 and 17, an LD-height-adjusting plate 102A, a sub-mount 103, and a semiconductor laser element 104 are mounted in this order in a package 101A of a semiconductor laser module 100A. A lead pin 105 is connected to the semiconductor laser module 100A. On an optical path of a laser light outputted by the semiconductor laser element 104 and in the package 101, a first lens 106, a second lens 107, a filter 108, and a third lens 109 are fixed in this order. Moreover, the optical fiber 112 being faced to the third lens 109 and fixed by the optical-fiber-holding unit 111 is fixed in the package 101. An optical fiber insertion port 101Aa is provided in the package 101A. The optical fiber 112 is inserted through the optical fiber insertion port 101Aa, and the optical fiber insertion port 101Aa is sealed by an insertion-portion-fixing agent 113.

The package 101A corresponds to the package 101 of the semiconductor laser module 100 according to Embodiment 1, and each optical element is fixed to the package 101A. The LD-height-adjusting plate 102A corresponds to the LD-height-adjusting plate 102 and is fixed inside the package 101A to adjust the height of the semiconductor laser element 104. Explanations for the sub-mount 103, the semiconductor laser element 104, the lead pin 105, the first lens 106, the second lens 107, the filter 108, the third lens 109, and the optical-fiber-holding unit 111 will be omitted since configurations and functions thereof are similar to those of the corresponding elements of the semiconductor laser module 100 according to Embodiment 1.

An operation of the semiconductor laser module 100A will be explained. At first, a voltage is applied to, and a current is injected to, the semiconductor laser element 104 from the lead pin 105, then a laser light is emitted from the semiconductor laser element 104 in the z-direction. The laser light emitted from the semiconductor laser element 104 is made an approximate collimated light by the first lens 106 and the second lens 107. The approximate collimated laser light is condensed by the third lens 109 as a light-condensing portion, and then coupled to the optical fiber 112. The laser light coupled to the optical fiber 112 is guided by the optical fiber 112 and outputted to outside the semiconductor laser module 100A.

Herein in the optical-fiber-holding unit 111, similarly to the case of Embodiment 1, the fixing agent 114a is formed at the outer fixing area S2 relative to the leakage light in the x-axis direction corresponding to the major axis direction in the oval of the field of the light incident into the optical fiber 112, and the fixing agent 114B is formed at the inner fixing area S1. Hereby the leakage light irradiated to the fixing agent 114a and the fixing agent 114B is sufficiently weak, thus the fixing agent 114a and the fixing agent 114B will not be melted or damaged. Therefore, the semiconductor laser module 100A according to Embodiment 2 is a highly reliable semiconductor laser module at even when being operated at higher output.

Hereafter, a semiconductor laser module according to the modified examples of the semiconductor laser module 100 according to Embodiment 1 will be explained. Since the semiconductor laser module according to the modified examples has a configuration replacing the optical-fiber-holding unit 111 of the semiconductor laser module 100 with an optical-fiber-holding unit according to the modified examples, the optical-fiber-holding unit according to the modified examples will be explained mainly below. The optical-fiber-holding unit according to the modified examples can be adapted to a semiconductor laser module according to other embodiments of the present invention.

Modified Example 2

Figure 18:
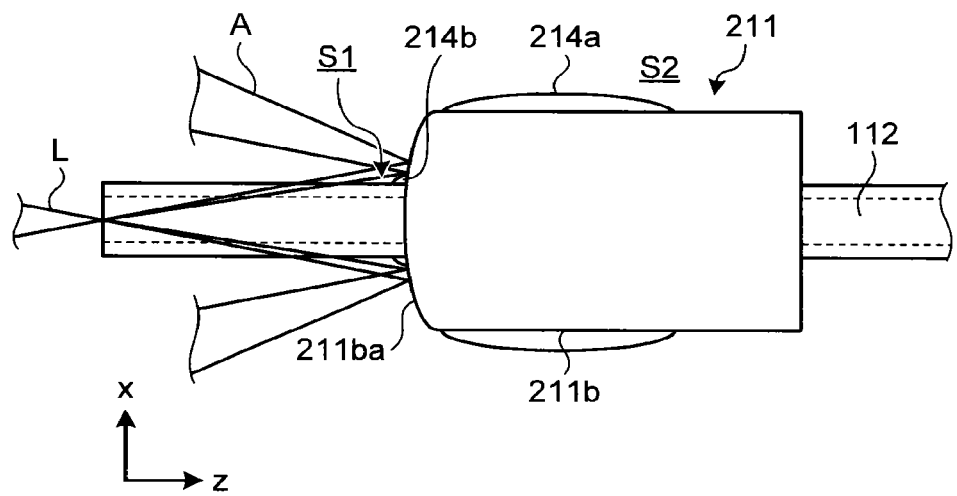
FIG. 18 is a schematic x-z plan view of an optical-fiber-holding unit according to Modified Example 2.

FIG. 18 is a schematic x-z plan view of an optical-fiber-holding unit according to Modified Example 2. As shown in FIG. 18, a laser-light-L-incident side's end surface of a ferrule 211b of an optical-fiber-holding unit 211 according to the present modified example has a curved surface 211ba. The ferrule 211b is fixed on a pedestal not shown in the drawings by a fixing agent 214a. Moreover, the ferrule 211b is inserted with the optical fiber 112. The ferrule 211b and the optical fiber 112 are fixed by the fixing agent 214b. Hereby the optical-fiber-holding unit 211 holds the optical fiber 112. The fixing agents 214a and 214b are made of a material similar to that of the fixing agents 114a and 114b, and provided at the outer fixing area S2 and the inner fixing area S1 respectively.

Herein a part of the leakage light A produced from the laser light L is irradiated to the ferrule. In case that the laser-light-L-incident side's end surface of the ferrule is a plane that is orthogonal to the waveguide direction (center axis) of the optical fiber 112, the leakage light A is irradiated approximately orthogonal to the laser-light-L-incident side's end surface. On the other hand, in the optical-fiber-holding unit 211 according to Modified Example 2, the leakage light A is irradiated to the curved surface 211ba with an angle since the laser-light-L-incident side's end surface of the ferrule 211b has the curved surface 211ba. Since such angled irradiation causes more reflection than in the case of vertical irradiation of the leakage light A, the amount of the leakage light A being absorbed by the ferrule 211b can be reduced. Therefore, it is possible to prevent the fixing agent 214a or the fixing agent 214b from being melted due to an increase in temperature of the ferrule 211b absorbing the leakage light A. Moreover, it is possible to prevent the leakage light reflected by the ferrule 211b from being irradiated to the fixing agent 214a or the fixing agent 214b. Therefore, the semiconductor laser module using the optical-fiber-holding unit 211 according to Modified Example 2 as such is a more reliable semiconductor laser module even when being operated at higher output. The laser-light-L-incident side's end surface of the ferrule 211b is not limited to the curved surface 211ba, and may be an inclined surface angled relative to the direction in which the leakage light A is incident.

Modified Example 3

Figure 19:
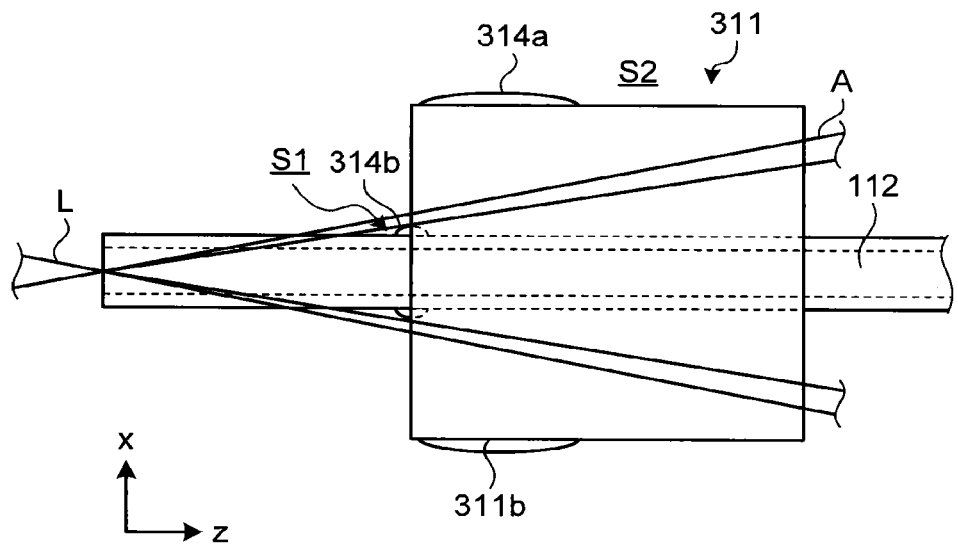
FIG. 19 is a schematic x-z plan view of an optical-fiber-holding unit according to Modified Example 3.

FIG. 19 is a schematic x-z plan view of an optical-fiber-holding unit according to Modified Example 3. As shown in FIG. 19, a ferrule 311b of an optical-fiber-holding unit 311 according to Modified Example 3 is made of zirconia or glass that is approximately transparent to the leakage light A. The ferrule 311b is fixed on a pedestal not shown in the drawings by a fixing agent 314a. Moreover, the ferrule 311b and the optical fiber 112 inserted through the ferrule 311b are fixed by a fixing agent 314b. Hereby the optical-fiber-holding unit 311 holds the optical fiber 112. The fixing agents 314a and 314b are made of a material similar to that of the fixing agents 114a and 114b and provided at the outer fixing area S2 and the inner fixing area S1 respectively.

The leakage light A irradiated to the ferrule 311b is transmitted through the ferrule 311b of the optical-fiber-holding unit 311. That is, the leakage light A is not absorbed by the ferrule 311b. Hereby it is possible to prevent the fixing agent 314a or the fixing agent 314b from being melted due to an increase in the temperature of the ferrule 311b. Therefore, the semiconductor laser module using the optical-fiber-holding unit 211 according to Modified Example 3 as such is a more reliable semiconductor laser module even when being operated at higher output. In order to prevent the leakage light A reflected by the ferrule 311b from being irradiated to the fixing agent 314a or the fixing agent 314b, an anti-reflection layer may be formed at the laser-light-L-incident side's end surface of the ferrule 311b.

Modified Example 4

Figure 20:
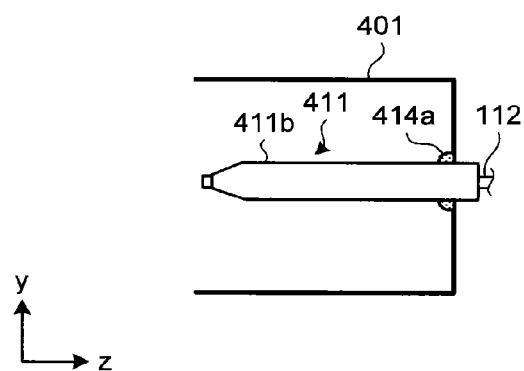
FIG. 20 is a schematic y-z plan view of an optical-fiber-holding unit according to Modified Example 4.
Figure 21:
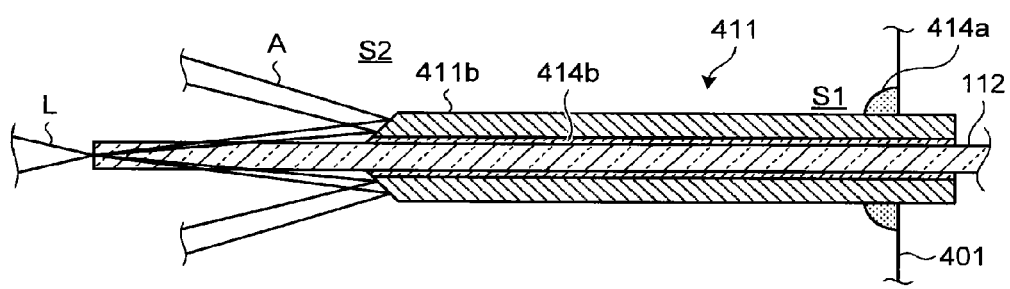
FIG. 21 is a schematic y-z cross-sectional view of an optical-fiber-holding unit according to Modified Example 4.

FIG. 20 is a schematic x-z plan view of an optical-fiber-holding unit according to Modified Example 4, and FIG. 21 is a cross-sectional view thereof. As shown in FIGS. 20 and 21, a metallic ferrule 411b of an optical-fiber-holding unit 411 according to Modified Example 4 is fixed directly to a package 401 of the semiconductor laser module. The optical fiber 112 is fixed to the ferrule 411b by a fixing agent not shown in the drawings. The optical-fiber-holding unit according to Modified Example 4 as such has a configuration not using a pedestal. As shown in FIG. 21, the fixing agents 414a and 414b are made of material similar to those of the fixing agents 114a and 114b and provided at the outer fixing area S2 and at an insertion hole of the ferrule 411b in the inner fixing area S1 respectively. Therefore, the semiconductor laser module using the optical-fiber-holding unit 411 according to Modified Example 4 as such is a more reliable semiconductor laser module even when being operated at higher output.

Since the position at which the ferrule 411b is fixed to the package 401 is sufficiently distant from the laser-light-L-incident side's end portion of the optical fiber 112, the leakage light is sufficiently weak. Therefore, the ferrule 411b may be fixed to the package 401 by the fixing agent 414a, and may be alternatively fixed to the package 401 by a mechanical fixing method such as a screw. Since the optical fiber 112 can be fixed to the ferrule 411b with a small amount of fixing agent 414b, the fixing agent 414b can be formed at the outer fixing area or the inner fixing area easily. Hereby the leakage light irradiated to the fixing agents 414a and 414b is sufficiently weak, thus it is possible to prevent the fixing agent from being melted or damaged.

Embodiment 3

Figure 22:
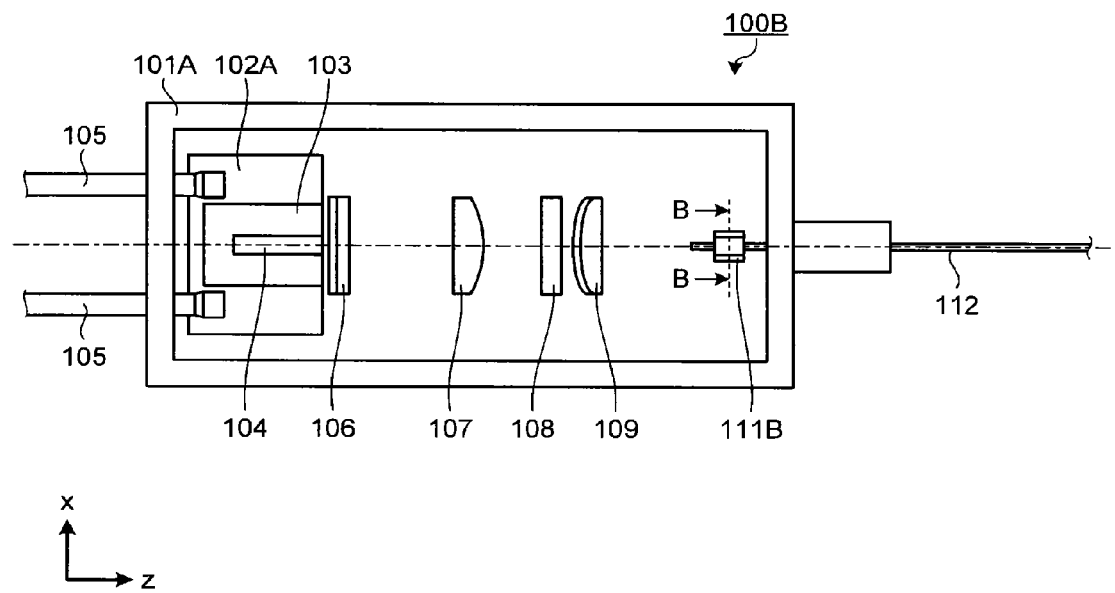
FIG. 22 is a schematic plan view of a semiconductor laser module according to Embodiment 3 of the present invention.
Figure 23:
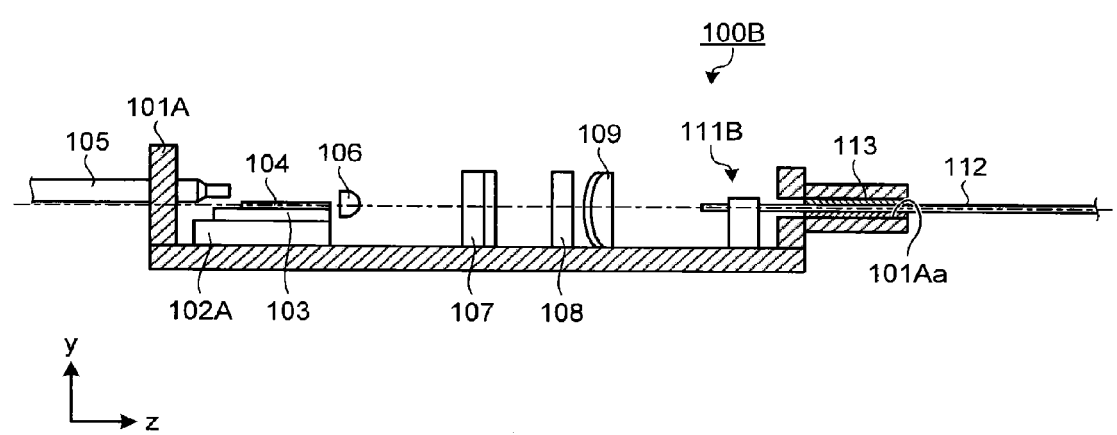
FIG. 23 is a schematic partially cutout view of the semiconductor laser module shown in FIG. 22.

FIG. 22 is a schematic plan view of a semiconductor laser module according to Embodiment 3 of the present invention. FIG. 23 is a schematic partially cutout view of the semiconductor laser module shown in FIG. 22. As shown in FIGS. 22 and 23, a semiconductor laser module 100B according to Embodiment 3 has a configuration in which the optical-fiber-holding unit 111 of the semiconductor laser module 100 according to Embodiment 1 is replaced with an optical-fiber-holding unit 111B.

Figure 24:
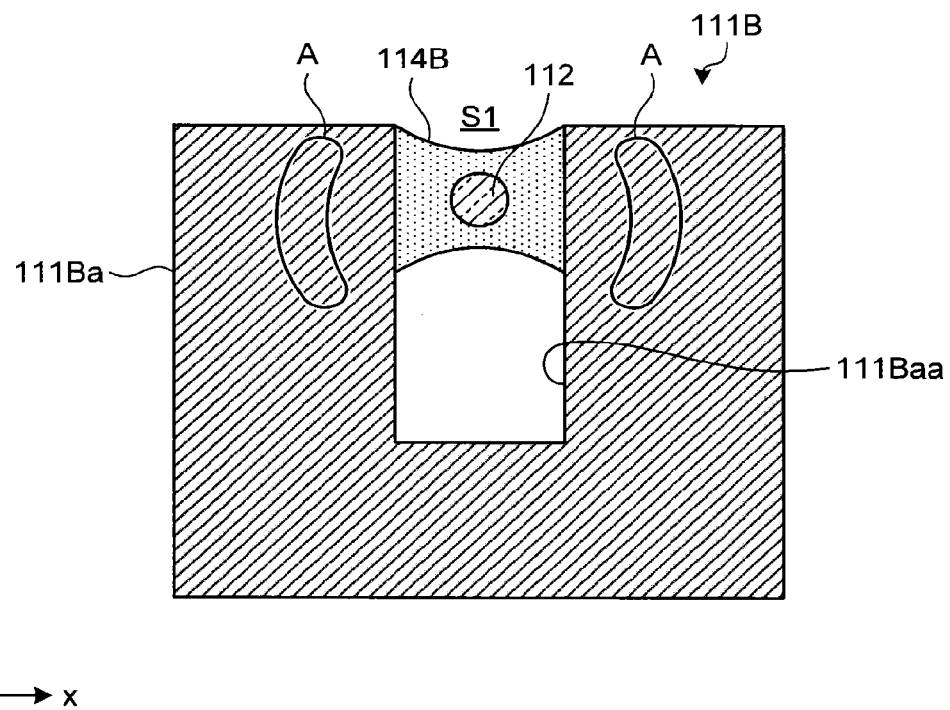
FIG. 24 is a cross sectional view of the optical-fiber-holding unit taken from line B-B of FIG. 22.

FIG. 24 is a cross sectional view of the optical-fiber-holding unit taken from line B-B of FIG. 22. As shown in FIG. 24, the optical-fiber-holding unit 111B is provided with a pedestal 111Ba having a groove 111Baa extending along the z-direction as a waveguide direction of the optical fiber 112. The optical fiber 112 is fixed inside the groove 111Baa with the fixing agent 114B. The width of the groove 111Baa in this state is sufficiently narrow so that the fixing agent 114B is accommodated in the inner fixing area S1 relative to the leakage light A. Hereby the leakage light A is not irradiated to the fixing agent 114B since the fixing agent 114B is provided inside the inner fixing area S1. Therefore, the semiconductor laser module 100B according to Embodiment 3 is a highly reliable semiconductor laser module even when being operated at higher output. As described above, the effect of the present invention can be obtained with a structure which restrains the fixing agent from being spread with which the fixing agent is limited to be formed at the inner fixing area or the outer fixing area.

When fixing the optical fiber with the fixing agent, the optical fiber is shifted sometimes due to contraction of the fixing agent after being bonded with and along with curing thereof. Shifting of the optical fiber is not preferable since the coupling efficiency is deteriorated. Herein in the semiconductor laser module 100B according to Embodiment 3, the optical fiber 112 is fixed to the pedestal 111Ba having the groove 111Baa. When the fixing agent 114B is injected to the groove 111Baa in this state, the optical fiber 112 is not shifted since contraction along with curing of the fixing agent 114B occurs isotropically in a cross-sectional direction (direction in the x-y plane) of the optical fiber 112. As described above, the semiconductor laser module 100B according to Embodiment 3 is configured to restrain the optical fiber 112 from being shifted along with the curing of the fixing agent 114B.

Modified Example 5

Figure 25:
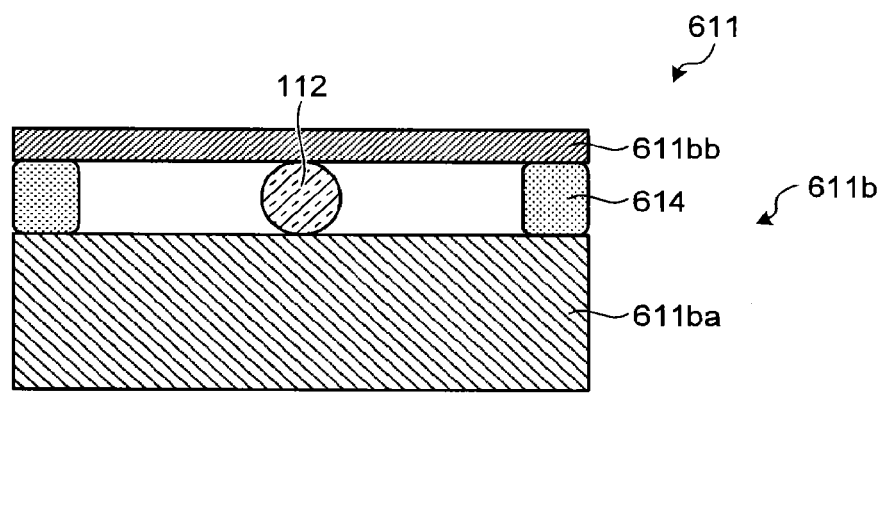
FIG. 25 is a schematic y-z cross-sectional view of an optical-fiber-holding unit according to Modified Example 5.

FIG. 25 is a schematic y-z cross-sectional view of an optical-fiber-holding unit according to Modified Example 5.

As shown in FIG. 25, an optical-fiber-holding unit 611 according to Modified Example 5 includes an optical-fiber-fixing member 611b as a holding member including an optical-fiber-fixing member 611ba and an optical-fiber-fixing member 611bb, and a fixing agent 614. It is preferable that the optical-fiber-fixing member 611ba and the optical-fiber-fixing member 611bb be not melted by a non-coupled light and a leakage light of a laser light and that the optical-fiber-fixing member 611ba and the optical-fiber-fixing member 611bb be made of an inflammable material or that an optical absorptivity relative to the laser light be equal to or less than 30%. For a material as such, the optical-fiber-fixing member 611ba and the optical-fiber-fixing member 611bb are made of, for example, glass of which heat resistance is equal to or higher than 1000° C. or ceramic. It is preferable that the optical-fiber-fixing member 611b be used of which heat resistance is equal to or greater than 500° C. In order to prevent from being melted by the laser light, the optical-fiber-fixing member 611ba and the optical-fiber-fixing member 611bb may be configured to be provided with a reflection layer of which reflectivity at a wavelength of the laser light at the third lens 109's side (see FIGS. 1 and 2) is equal to or greater than 70%, or more preferably equal to or greater than 90%. The reflection layer is made of, for example, a metal layer or a dielectric multi-layer for a material as such. The fixing agent 614 is configured by, for example, organic adhesive such as ultraviolet curable resin and thermosetting resin, solder, low melting glass, and inorganic adhesive, and from the viewpoint of handling capability, epoxy resin and urethane-based resin are used.

In the optical-fiber-holding unit 611, the optical-fiber-fixing member 611ba having a function for the pedestal as well is fixed inside the package 101. By bonding the optical-fiber-fixing member 611ba to the optical-fiber-fixing member 611bb with the fixing agent 614, the optical fiber 112 is sandwiched, pressed, and fixed, vertically by the optical-fiber-fixing member 611ba and the optical-fiber-fixing member 611bb. Hereby the optical-fiber-holding unit 611 fixes and holds the optical fiber 112.

The fixing agent 614 and the optical fiber 112 are not contacted directly but separated. The fixing agent 614 separated as such is disposed at a position that is more distant from the optical fiber 112 than an area, in the vicinity of the optical fiber 112, where the leakage light from the optical fiber 112 is intense, and at an area corresponding to the outer fixing area through which the leakage light does not pass. Hereby the leakage light is not irradiated to the fixing agent 614, thus, the fixing agent 614 will not be melted or damaged. Therefore, the semiconductor laser module using the optical-fiber-holding unit 611 according to Modified Example 5 as such is a highly reliable semiconductor laser module even when being operated at higher output.

Modified Example 6

Figure 26:
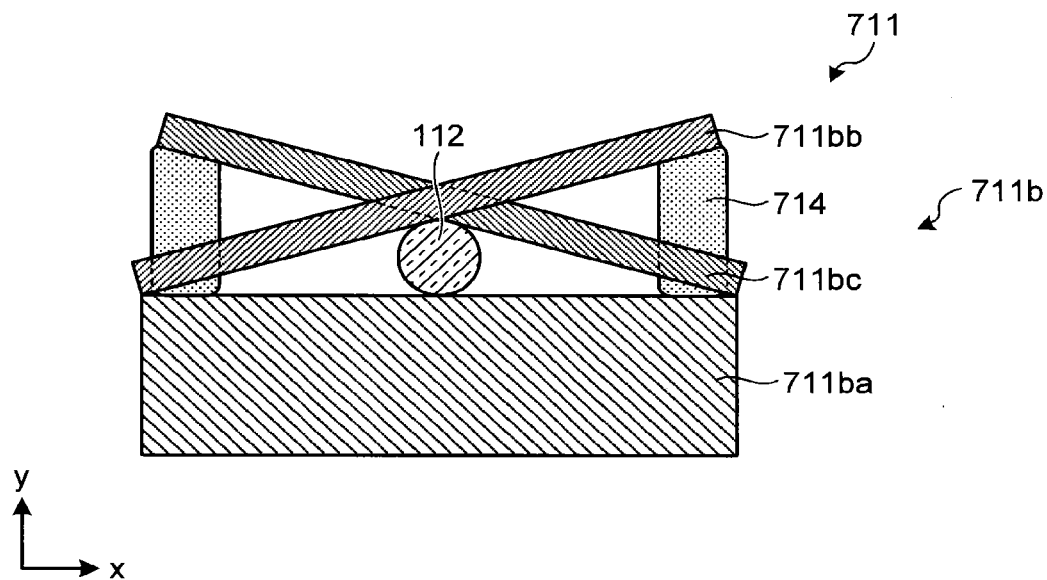
FIG. 26 is a schematic x-y cross-sectional view of an optical-fiber-holding unit according to Modified Example 6.
Figure 27:
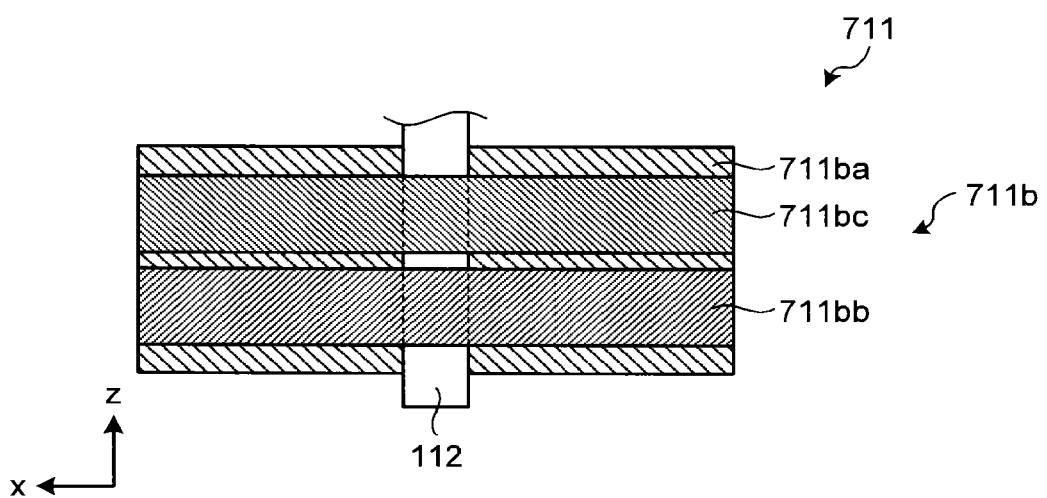
FIG. 27 is a schematic x-z plan view of an optical-fiber-holding unit according to Modified Example 6.

FIG. 26 is a schematic x-y cross-sectional view of an optical-fiber-holding unit according to Modified Example 6. FIG. 27 is a schematic x-z plan view of the optical-fiber-holding unit according to Modified Example 6. As shown in FIG. 26, an optical-fiber-holding unit 711 according to Modified Example 6 includes an optical-fiber-fixing member 711b as a holding member including three optical-fiber-fixing members 711ba, 711bb, and 711bc, and a fixing agent 714. As shown in FIG. 27, the optical-fiber-fixing member 711bb and the optical-fiber-fixing member 711bc are disposed side by side in the waveguide direction of the optical fiber 112 on the optical-fiber-fixing member 711ba. The optical-fiber-fixing member 711b and the fixing agent 714 are made of materials similar to those of the optical-fiber-fixing member 611b and the fixing agent 614 respectively.

In the optical-fiber-holding unit 711, the optical-fiber-fixing member 711ba having the function for the pedestal as well is fixed inside the package. By bonding the optical-fiber-fixing member 711ba, the optical-fiber-fixing member 711bb, and optical-fiber-fixing member 711bc with the fixing agent 714, the optical fiber 112 is sandwiched, pressed, and fixed, by the optical-fiber-fixing member 711ba, the optical-fiber-fixing member 711bb, and the optical-fiber-fixing member 711bc in three directions. Hereby the optical-fiber-holding unit 711 fixes and holds the optical fiber 112. As described above, the optical-fiber-fixing member may be configured by equal to or more than three members.

The fixing agent 714, not being contacted to the optical fiber 112 directly but being separated therefrom, is disposed at a position that is more distant from the optical fiber 112 than an area through which the leakage light from the optical fiber 112 passes, and at an area corresponding to the outer fixing area through which the leakage light does not pass. Hereby the leakage light is not irradiated to the fixing agent 714, thus, the fixing agent 714 will not be melted or damaged. Therefore, the semiconductor laser module using the optical-fiber-holding unit 711 according to Modified Example 6 as such is a highly reliable semiconductor laser module even when being operated at higher output.

Modified Example 7

Figure 28:
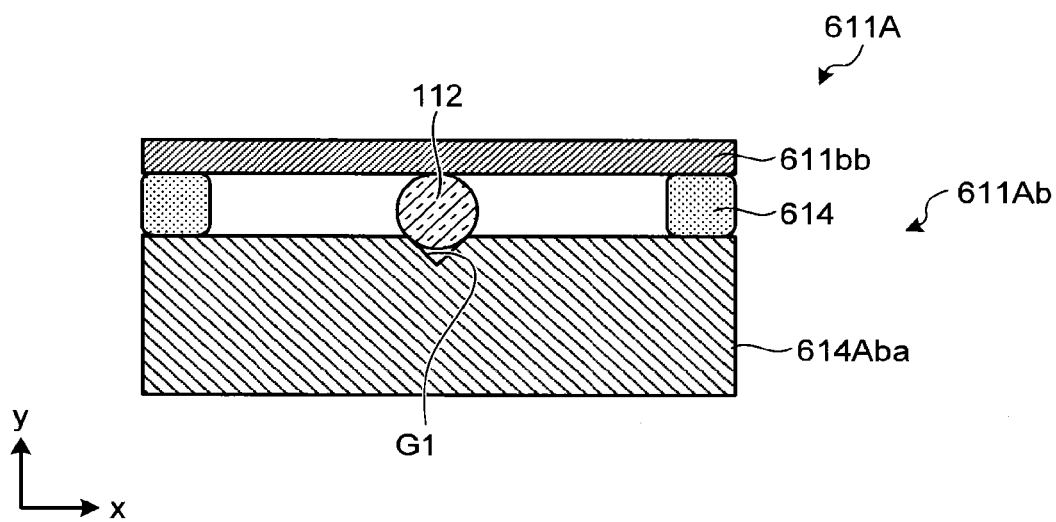
FIG. 28 is a schematic x-y cross-sectional view of an optical-fiber-holding unit according to Modified Example 7.

FIG. 28 is a schematic x-y cross-sectional view of an optical-fiber-holding unit according to Modified Example 7. As shown in FIG. 28, an optical-fiber-holding unit 611A according to Modified Example 7 is of a configuration replacing the optical-fiber-fixing member 611b of the optical-fiber-holding unit 611 according to Modified Example 5 with an optical-fiber-fixing member 611Ab. The optical-fiber-fixing member 611Ab is of a configuration replacing the optical-fiber-fixing member 611ba having the function for the pedestal of the optical-fiber-fixing member 611b as well with an optical-fiber-fixing member 611Aba. The optical-fiber-fixing member 611Aba is provided with a V-shaped optical-fiber-fixing groove G1 extending along the z-direction in which the optical fiber 112 extends.

In the optical-fiber-holding unit 611A, similarly to the optical-fiber-holding unit 611, the optical fiber 112 is sandwiched, pressed, and fixed, by the optical-fiber-fixing member 611Aba and the optical-fiber-fixing member 611bb bonded with the fixing agent 614. Moreover, in the optical-fiber-holding unit 611A, since the optical-fiber-fixing member 611Aba is provided with the optical-fiber-fixing groove G1, the optical fiber 112, a part of which is accommodated in the optical-fiber-fixing groove G1, is configured to be hardly shifted in the x-direction. Hereby, the optical-fiber-holding unit 611A fixes and holds the optical fiber 112.

Similarly to the case of the optical-fiber-holding unit 611, the fixing agent 614, not being contacted to the optical fiber 112 directly but being separated therefrom, is disposed at a position that is more distant from the optical fiber 112 than an area through which the leakage light from the optical fiber 112 passes, and at an area corresponding to the outer fixing area through which the leakage light does not pass. Hereby the leakage light is not irradiated to the fixing agent 614, thus, the fixing agent 614 will not be melted or damaged. Therefore, the semiconductor laser module using the optical-fiber-holding unit 611 according to Modified Example 7 as such is a highly reliable semiconductor laser module even when being operated at higher output. The optical-fiber-fixing groove G1 may be of a configuration restraining the optical fiber 112 from being shifted in the x-direction and may not be limited to be a V-letter shape. The optical-fiber-fixing groove G1 may be, for example, of a half-round shape, or a groove shape of which width is narrower than the diameter of the optical fiber 112.

Modified Example 8

Figure 29:
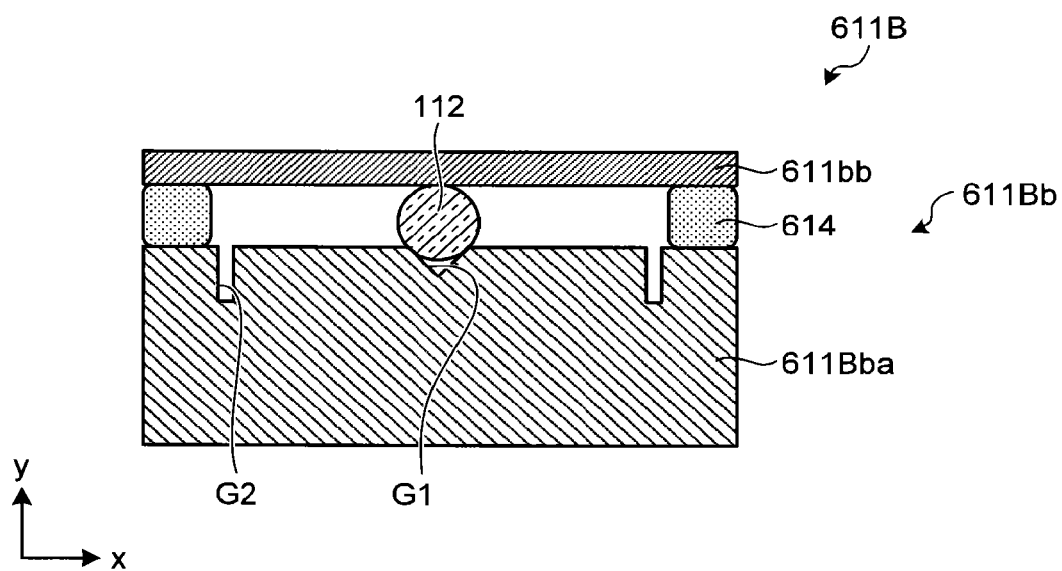
FIG. 29 is a schematic x-y cross-sectional view of an optical-fiber-holding unit according to Modified Example 8.

FIG. 29 is a schematic x-y cross-sectional view of an optical-fiber-holding unit according to Modified Example 8. As shown in FIG. 29, an optical-fiber-holding unit 611B according to Modified Example 8 is of a configuration replacing the optical-fiber-fixing member 611*b* of the optical-fiber-holding unit 611 according to Modified Example 5 with an optical-fiber-fixing member 611Bb. The optical-fiber-fixing member 611Bb is of a configuration replacing the optical-fiber-fixing member 611*ba* having the function for the pedestal of the optical-fiber-fixing member 611*b* as well with an optical-fiber-fixing member 611Bba. The optical-fiber-fixing member 611Bba is provided with a V-shaped optical-fiber-fixing groove G1 extending along the z-direction as a direction in which the optical fiber 112 extends and a flow-stopping groove G2 as a portion stopping the flow of the fixing agent 614. The flow-stopping groove G2 is formed to be interposed between the optical fiber 112 and the fixing agent 614.

In the optical-fiber-holding unit 611B, similarly to the optical-fiber-holding unit 611A, the optical fiber 112 is sandwiched, pressed, and fixed, by the optical-fiber-fixing member 611Bba and the optical-fiber-fixing member 611*bb* bonded with the fixing agent 614. Moreover, the optical fiber 112 is configured so that a part of which is accommodated in the optical-fiber-fixing groove G1 to be hardly shifted in the x-direction. Hereby the optical-fiber-holding unit 611B fixes and holds the optical fiber 112. Moreover, when assembling the optical-fiber-holding unit 611B, the flow-stopping groove G2 being formed as such prevents the fixing agent 614, for example, as resin from flowing prior to being cured and from contacting the optical fiber 112. Moreover, the flow-stopping groove G2 prevents the fixing agent 614 prior to being cured from flowing into the area through which the leakage light passes. Hereby, it is possible more reliably to form the fixing agent 614 so as to not contact directly, but separated from, the optical fiber 112. Hereby the leakage light is not irradiated to the fixing agent 614, thus, the fixing agent 614 will not be melted or damaged. Therefore, the semiconductor laser module using the optical-fiber-holding unit 611B according to Modified Example 8 as such is a highly reliable semiconductor laser module even when being operated at higher output. The flow-stopping groove G2 as a flow-stopping portion may be of any configuration capable of stopping the flow of the fixing agent 614. Moreover, the barrage portion is not limited to a groove and may be, for example, a protrusion portion, an inclination or the like.

Modified Example 9

Figure 30:
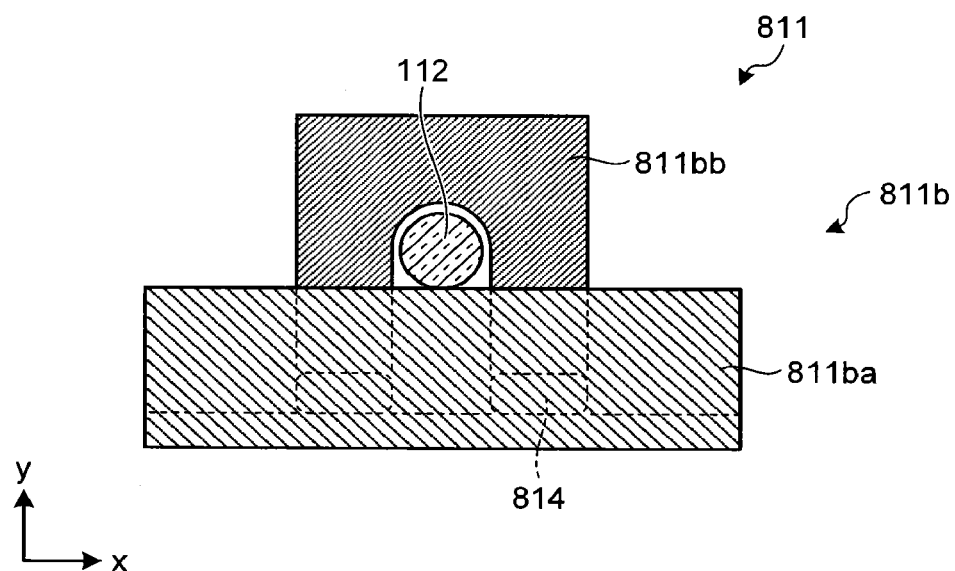
FIG. 30 is a schematic x-y cross-sectional view of an optical-fiber-holding unit according to Modified Example 9.
Figure 31:
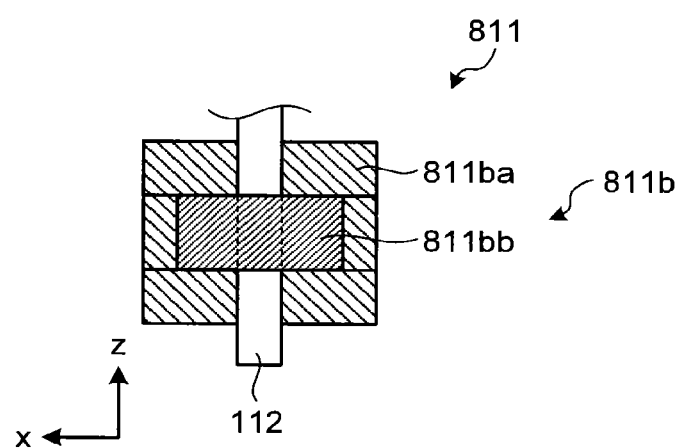
FIG. 31 is a schematic x-z plan view of an optical-fiber-holding unit according to Modified Example 9.

FIG. 30 is a schematic x-y cross-sectional view of an optical-fiber-holding unit according to Modified Example 9. FIG. 31 is a schematic x-z plan view of the optical-fiber-holding unit according to Modified Example 9. As shown in FIGS. 30 and 31, an optical-fiber-holding unit 811 according to Modified Example 9 includes an optical-fiber-fixing member 811*b* as a holding member including optical-fiber-fixing members 811*ba* and 811*bb*, and a fixing agent 814. The optical-fiber-fixing member 811*b* and the fixing agent 814 are made of materials similar to those of the optical-fiber-fixing member 611*b* and the fixing agent 614 respectively.

In the optical-fiber-holding unit 811, the optical-fiber-fixing member 811*ba* having the function for the pedestal as well is fixed in the package. By fitting the optical-fiber-fixing member 811*bb* having a U-shaped groove to the optical-fiber-fixing member 811*ba* and bonding the optical-fiber-fixing member 811*ba* to the optical-fiber-fixing member 811*bb* with the fixing agent 814, the optical fiber 112 is sandwiched, pressed, and fixed, by the optical-fiber-fixing member 811*ba* and the optical-fiber-fixing member 811*bb*. Herein the optical fiber 112 is configured to be hardly shifted in each of the x and y directions because the optical-fiber-fixing member 811*bb* is formed to cover the optical fiber 112. Hereby the optical-fiber-holding unit 811 fixes and holds the optical fiber 112.

The fixing agent 814, not being contacted to the optical fiber 112 directly but being separated therefrom, is disposed at a position that is more distant from the optical fiber 112 than an area through which the leakage light from the optical fiber 112 passes, and at an area corresponding to the outer fixing area through which the leakage light does not pass. Hereby the leakage light is not irradiated to the fixing agent 814, thus, the fixing agent 814 will not be melted or damaged. Therefore, the semiconductor laser module using the optical-fiber-holding unit 811 according to Modified Example 9 as such is a highly reliable semiconductor laser module even when being operated at higher output. As described above, the optical-fiber-fixing member can be shaped variously for fixing the optical fiber 112.

As described above, according to the above-described embodiments, a highly reliable semiconductor laser module even when being operated at higher output can be provided.

It should be noted that, in the above-described embodiments, the fixing agent is not limited to resin and may be a fixing portion based on various fixing methods such as a screw, a clip, and a tape or the like. When being irradiated by the leakage light, even the fixing portion as such may possibly be subjected to an increase in coupling loss due to deformation by being melted or deteriorated, deformation due to thermal expansion, or damage or the like. Therefore, a highly reliable semiconductor laser module even when being operated at higher output can be provided by forming the fixing portion with the fixing area or the like including the inner fixing area and the outer fixing area.

As described above, the semiconductor laser module according to the present invention is suitable for use mainly as a high output semiconductor laser module.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. A semiconductor laser module comprising:
   a semiconductor laser element emitting a laser light;
   an optical fiber, into which the laser light emitted from the semiconductor laser element is incident, guiding the laser light; and
   an optical-fiber-holding unit having a fixing agent and holding the optical fiber, the fixing agent being for fixing the optical fiber, wherein the fixing agent is provided at an area in which a power of a leakage light of the laser light having been incident into the optical fiber and then emitted to outside the optical fiber is low, the area in which the power of the leakage light is low includes an outer fixing area and an inner fixing area the outer fixing area having an angle equal to or greater than 15° from a cross-sectional center of an end portion of a side, into which the laser light is incident, of the optical fiber relative to a center axis of the optical fiber in a direction in which a diameter of a field of the laser light incident into the optical fiber is the longest, the inner fixing area having an angle equal to or smaller than $-1.15\,\theta_{in}+12.5°$ relative to the center axis of the optical fiber where $\theta_{in}$ is an incident angle of the laser light incident into the optical fiber relative to the center axis of the optical fiber, and the fixing agent is provided at at least one of the outer fixing area and the inner fixing area.

2. The semiconductor laser module according to claim 1, wherein an output of the laser light emitted from the semiconductor laser element is equal to or greater than 10 W, an intensity of the leakage light in the area in which the fixing agent is provided is less than 130 W/mm² in a plane that is orthogonal to the laser light.

3. The semiconductor laser module according to claim 1, wherein the optical-fiber-holding unit comprises a pedestal having a groove extending along a waveguide direction of the optical fiber, and the optical fiber is fixed in the groove by the fixing agent.

4. The semiconductor laser module according to claim 3, wherein the groove is formed in the inner fixing area.

5. The semiconductor laser module according to claim 1, wherein the fixing agent is separated from the optical fiber.

6. The semiconductor laser module according to claim 1, wherein the fixing agent is made of one of organic adhesive, solder, low melting glass, and inorganic adhesive.

7. The semiconductor laser module according to claim 1, wherein the optical fiber is a multi-mode optical fiber.

8. A semiconductor laser module comprising:
a semiconductor laser element emitting a laser light;
an optical fiber, into which the laser light emitted from the semiconductor laser element is incident, guiding the laser light; and
an optical-fiber-holding unit having a fixing agent and holding the optical fiber, the fixing agent being for fixing the optical fiber, wherein
the fixing agent is provided at an area in which a power of a leakage light of the laser light having been incident into the optical fiber and then emitted to outside the optical fiber is low,
the optical-fiber-holding unit comprises a holding member holding the optical fiber inserted therethrough,
the optical fiber and the holding member are fixed by the fixing agent,
the area in which the power of the leakage light is low is an inner fixing area having an angle equal to or smaller than $-1.15\,\theta_{in}+12.5°$ relative to a center axis of the optical fiber from a cross-sectional center of an end portion of a side, into which the laser light is incident, of the optical fiber where $\theta_{in}$ is an incident angle of the laser light incident into the optical fiber, and in a direction in which a diameter of a field of the laser light incident into the optical fiber is the longest relative to the center axis of the optical fiber,
the fixing agent is provided at the inner fixing area, and an end portion of a side, into which the laser light is incident, of the holding member is configured to reflect a light passing through a leakage light's pathway area having an angle equal to or great than $-1.15\,\theta_{in}+12.5°$ and less than 15° from the cross-sectional center of the end option of the side, into which the laser light is incident, of the optical fiber relative to the center axis of the optical fiber in the direction in which the diameter of the field of the laser light incident into the optical fiber is the longest.

9. The semiconductor laser module according to claim 8, wherein an end surface, into which the laser light is incident, of the holding member is a curved surface or an inclined surface inclining relative to the center axis of the optical fiber.

10. The semiconductor laser module according to claim 8, wherein the holding member is made of a material of which absorptivity is equal to or less than 30% at a wavelength of the laser light.

11. The semiconductor laser module according to claim 8, wherein the holding member is made of metal or ceramics.

12. The semiconductor laser module according to claim 8, wherein the holding member comprises a reflection layer at the end portion of the side, into which the laser light is incident, a reflectivity of the reflection layer is equal to or greater than 70% at a wavelength of the laser light.

13. The semiconductor laser module according to claim 8, wherein an output of the laser light emitted from the semiconductor laser element is equal to or greater than 10 W, an intensity of the leakage light in the area in which the fixing agent is provided is less than 130 W/mm² in a plane that is orthogonal to the laser light.

14. The semiconductor laser module according to claim 8, wherein the fixing agent is made of one of organic adhesive, solder, low melting glass, and inorganic adhesive.

15. The semiconductor laser module according to claim 8, wherein the optical fiber is a multi-mode optical fiber.

16. A semiconductor laser module comprising:
a semiconductor laser element emitting a laser light;
an optical fiber, into which the laser light emitted from the semiconductor laser element is incident, guiding the laser light; and
an optical-fiber-holding unit having a fixing agent and holding the optical fiber, the fixing agent being for fixing the optical fiber, wherein
the fixing agent is provided at an area in which a power of leakage light of the laser light having been incident into the optical fiber and then emitted to outside the optical fiber is low,
the optical-fiber-holding unit comprises a holding member and a pedestal, the holding member being fixed to the pedestal and holding the optical fiber inserted therethrough,
the optical fiber and the holding member are fixed by the fixing agent,
the area in which the power of the leakage light is low is an inner fixing area having an angle equal to or smaller than $-1.15\,\theta_{in}+12.5°$ relative to a center axis of the optical fiber from a cross-sectional center of an end portion of a side, into which the laser light is incident, of the optical fiber where $\theta_{in}$ is an incident angle, relative to a center axis of the optical fiber, of the laser light incident into the optical fiber from the cross-sectional center of the end portion of the side, into which the laser light is incident, of the optical fiber, and in a direction in which a diameter of a field of the laser light incident into the optical fiber is the longest, the fixing agent is provided at the inner fixing area, the holding member transmits therethrough a light passing through a leakage light's pathway area having an angle equal to or greater than $-1.15\,\theta_{in}+12.5°$ and less than 15° relative to the center axis of the optical fiber in a direction in which a diameter of a field of the laser light incident into the optical fiber is the longest, and the holding member and the pedestal are fixed by the fixing agent in an area, which is other than a pathway of a light in the leakage light's pathway area and in which the power of the leakage light is low.

17. The semiconductor laser module according to claim 16, wherein the holding member is made of glass.

18. The semiconductor laser module according to claim 16, wherein an output of the laser light emitted from the semiconductor laser element is equal to or greater than 10 W, an intensity of the leakage light in the area in which the fixing agent is provided is less than 130 W/mm$^2$ in a place that is orthogonal to the laser light.

19. The semiconductor laser module according to claim 16, wherein the fixing agent is made of one of organic adhesive, solder, low melting glass, and inorganic adhesive.

20. The semiconductor laser module according to claim 16, wherein the optical fiber is a multi-mode optical fiber.

* * * * *